United States Patent
Fukami et al.

(10) Patent No.: US 8,174,086 B2
(45) Date of Patent: May 8, 2012

(54) MAGNETORESISTIVE ELEMENT, AND MAGNETIC RANDOM ACCESS MEMORY

(75) Inventors: Shunsuke Fukami, Tokyo (JP);
Nobuyuki Ishiwata, Tokyo (JP);
Tetsuhiro Suzuki, Tokyo (JP);
Kiyokazu Nagahara, Tokyo (JP);
Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 156 days.

(21) Appl. No.: 12/739,990

(22) PCT Filed: Oct. 28, 2008

(86) PCT No.: PCT/JP2008/069498
§ 371 (c)(1),
(2), (4) Date: Jun. 8, 2010

(87) PCT Pub. No.: WO2009/060749
PCT Pub. Date: May 14, 2009

(65) Prior Publication Data
US 2010/0237449 A1    Sep. 23, 2010

(30) Foreign Application Priority Data

Nov. 5, 2007 (JP) ................................ 2007-287901

(51) Int. Cl.
*H01L 29/82* (2006.01)
*G11C 11/02* (2006.01)

(52) U.S. Cl. ..................... 257/421; 257/E29.323; 438/3

(58) Field of Classification Search .......... 257/421–427, 257/E29.323; 438/3
See application file for complete search history.

(56) References Cited

U.S. PATENT DOCUMENTS
7,282,755 B2 * 10/2007 Pakala et al. .............. 257/295
2007/0139826 A1 * 6/2007 Carey et al. ................ 360/319

FOREIGN PATENT DOCUMENTS
| JP | 2005150303 A | 6/2005 |
| JP | 2005191032 A | 7/2005 |
| JP | 2006073930 A | 3/2006 |
| JP | 2006270069 A | 10/2006 |

(Continued)

OTHER PUBLICATIONS

International Search Report for PCT/JP2008/069498 mailed Feb. 3, 2009.

(Continued)

*Primary Examiner* — Jami M Valentine

(57) ABSTRACT

A magnetoresistive element is provided with a first magnetization free layer; a second magnetization free layer; a non-magnetic layer disposed adjacent to the second magnetization free layer; and a first magnetization fixed layer disposed adjacent to the second magnetization free layer on an opposite side of the second magnetization free layer. The first magnetization free layer is formed of ferromagnetic material and has a magnetic anisotropy in a thickness direction. On the other hand, the second magnetization free layer and the first magnetization fixed layer are formed of ferromagnetic material and have a magnetic anisotropy in an in-plane direction. The first magnetization free layer includes: a first magnetization fixed region having a fixed magnetization; a second magnetization fixed region having a fixed magnetization; and a magnetization free region connected to the first and second magnetization fixed regions and having a reversible magnetization. The magnetization free region and the second magnetization free layer are magnetically coupled. In addition, the center of mass of the magnetization free region and the center of mass of the second magnetization free layer are displaced in a particular in-plane direction.

14 Claims, 24 Drawing Sheets

FOREIGN PATENT DOCUMENTS

| WO | 2007020823 A | 2/2007 |
|---|---|---|
| WO | 2007119748 A | 10/2007 |

OTHER PUBLICATIONS

N. Sakimura et al., "MRAM Cell Technology for Over 500MHz SoC" 2006 Symposium On VLSI Circuits Digest of Technical Papers, IEEE, 2006, p. 136.

A. Yamaguchi et al., "Real-Space Observation of Current-Driven Domain Wall Motion in Submicron Magnetic Wires", Physical Review Letters. vol. 92, No. 7, Feb. 20, 2004, p. 077205-1-4.

A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

D. Ravelosona et al., "Threshold currents to domain walls in films with perpendicular anisotropy", Applied Physics Letters, vol. 90, 2007, p. 072508-1-3.

A. Thiaville et al., "Micromagnetic and understanding of current-driven domain wall motion in patterned nanowires", Europhysics Letters, 69 (6), Mar. 15, 2005, pp. 990-996.

* cited by examiner

MAGNETORESISTIVE ELEMENT, AND MAGNETIC RANDOM ACCESS MEMORY

This application is the National Phase of PCT/JP2008/069498, filed Oct. 28, 2008, which claims the priority based on Japanese Patent Application No. 2007-287901, filed on Nov. 5, 2007, and the disclosure of which is incorporated herein by reference.

TECHNICAL FIELD

The present invention relates to a magnetoresistive element and a magnetic random access memory, and more particularly to a domain wall'motion type magnetoresistive element and magnetic random access memory.

BACKGROUND ART

Magnetic random access memories (MRAMs) are expected to be nonvolatile memories which provide a high speed operation and an infinite number of rewritings, and vigorous developments thereof have been carried out. In an MRAM, a magnetoresistive element is integrated within a memory cell, and a data is stored as the orientation of the magnetization of the ferromagnetic layer of the magnetoresistive element. Although several approaches have been proposed as a method of switching the magnetization of the ferromagnetic layer, all of them are common with regard to the use of a current. In putting into the practical use, the reduction of the write current is very important, and there is a requirement lot the reduction down to 0.5 mA or less, preferably, to 0.2 mA or less, according to 2006 Symposium on VLSI circuits, Digest of Technical Papers, p. 136.

The most typical, one of data writing methods into an MRAM is to dispose an interconnection through which a write current is flown near the magnetoresistive element, and to switch the orientation of the magnetization of the ferromagnetic layer of the magnetoresistive element with a current magnetic field, which is generated by flowing the write current. This method is preferable in attaining the high speed MRAM, because the data write in one nanosecond or less can be achieved in principle. For example, Japanese Patent Publication No. P2005-150303A discloses a structure in which the magnetization of the end portion of a magnetization fixed layer is oriented in the film thickness direction, for an MRAM in which the data is written by the current magnetic field.

However, a magnetic'field necessary for switching the magnetization of magnetic material which has sufficient thermal stability and resistance against external magnetic field disturbance is typically several ten oersteds, and a large write current around several miliamperes is required to generate such a large magnetic field. When the write current is large, the chip area is inevitably increased and the power consumption necessary for writing is also increased, which causes poor competitiveness compared with other random access memories. In addition, when the size reduction of memory cells causes a further increase in the write current; this is undesirable from the viewpoint of scaling.

In recent years, the following two approaches have been proposed to solving such problems. The first approach is to use a spin injection magnetization reversal. In an MRAM using the spin injection magnetization reversal, a magnetoresistive element of a memory cell is provided with a film stack including a first ferromagnetic layer (often referred to as a magnetization free layer), a second ferromagnetic layer having a fixed magnetization (often, referred to as a magnetization fixed layer), and a tunnel barrier layer disposed between these ferromagnetic layers. In data writing into such an MRAM, the magnetization of the magnetization free layer is reversed by using an interaction caused between localized electrons in the magnetization free layer and spin-polarized conduction electrons when a current is sent between the magnetization free layer and the magnetization fixed layer. The occurrence of the spin injection magnetization reversal depends on the current density (not on the absolute value of the current), and thus, when the spin injection magnetization reversal is used in the data writing, the write current is decreased as the size of the memory cell is reduced. That is, the spin injection magnetization reversal can be said to be superior in the scaling property. However, a write current is required to flow through the tunnel barrier layer, which has a thin film thickness, in data writing. This causes a problem of rewriting durability and reliability. Also, a current path is commonly used in writing and reading, and this may cause an erroneous writing in reading. As thus described, there are several obstacles in attaining the practical use of the spin injection magnetization reversal, although the spin injection magnetization reversal is superior in the scaling property.

The second approach is to use the current-driven domain wall motion. The magnetization reversal using the current-driven domain wall motion allows solving the above-described problems caused by the spin injection magnetization reversal. An MRAM which uses the current-driven domain wall motion is disclosed in, for example, Japanese Patent Publications No. P2005-191032A, P2006-73930A, and P2006-270069A. In the most typical configuration of an MRAM which uses the current-driven domain wall motion, a ferromagnetic layer (often, referred to as a magnetic recording layer) for holding the data is provided with: a magnetization reversible portion having a reversible magnetization; and two magnetization fixed portions having fixed magnetizations and connected to the respective ends of the magnetization reversible portion. The data is stored as the magnetization of the magnetization reversible portion. The magnetizations of the two magnetization fixed portions are fixed to be approximately anti-parallel to each other. When the magnetizations are thus arranged, the domain wall is introduced into the magnetic recording layer. When a current is sent in the direction that passes through the domain wall, the domain wall is moved in the direction of conduction electrons, as reported in Physical Review Letters, vol. 92, number 7, p. 077205, (2004), and thus data can be written by sending a current through the magnetic recording layer. Also, the occurrence of the current-driven domain wall motion depends on the current density, and thus it can be concluded that the current-driven domain wall motion provides a good scaling property similarly to the spin injection magnetization reversal. In addition, the above-described problems of the spin injection magnetization reversal can be solved in a memory cell of an MRAM that uses the current-driven domain wall motion, since the write current does not flow though the insulating layer, and the write and read current paths are separately provided.

However, an MRAM that uses the current-driven domain wall motion suffers from a problem that the absolute value of the write current is relatively large. According to a large number of reports announced with regard to the observations of the current induction domain wall motion, the current density of about $1 \times 10^{-8}$ [A/cm$^2$] is necessary for the domain wall motion. In this case, the write current is 1 mA, when the width of the ferromagnetic film in which the domain wall motion occurs is 100 nm and the film thickness is 10 nm, for example. A further reduction in the write current may be achieved by decreasing the width and thickness of the ferromagnetic film; however, a fact is reported in which the current density necessary for the writing is further increased when the film thickness is reduced (for example, refer to Japanese Journal of Applied Physics, vol. 45, No. 5A, pp. 3850-3853, (2006)). Also, the reduction in the width of the ferromagnetic film down to 100 nm or less involves the severe difficulty from the viewpoint of the processing technique.

One promising approach for decreasing the current density is to use a film of vertical magnetic anisotropic material that has a magnetic anisotropy in the film thickness direction, as the magnetic recording layer (the layer in which the domain wall motion occurs). In the magnetoresistive element that uses the film made of the vertical magnetic anisotropic material, the threshold current density in the order of $10^6$ [A/cm$^2$] is observed [for example, refer to Applied Physics Letters, vol. 90, p. 072508 (2007)].

The use of the film made of vertical magnetic anisotropic material in the magnetic recording layer, however, makes it difficult to increase the magnetoresistance ratio (MR ratio), which corresponds to the SN ratio of the reading signal of the MRAM, resulting in a problem that the compatibility with the reading property is difficult. Recently, very large magnetoresistance ratios are reported mainly with respect to magnetic tunnel junctions having a structure of CoFeB/MgO/CoFeB; however, CoFeB is a material having a magnetic anisotropy in the in-plane direction. In addition, magnetic tunnel junctions have been developed with various materials; however, most of them are materials, having a magnetic anisotropy in the in-plane direction. As for the vertical magnetic anisotropic material, there are very few achievements in which a magnetic tunnel junction is obtained with a high magnetoresistance ratio and high reliability.

DISCLOSURE OF INVENTION

Therefore, an object of the present invention is to provide a technique for improving the magnetoresistance ratio of the magnetoresistive element in which a data-storing layer has a magnetic anisotropy in the film thickness direction.

A magnetoresistive element of the present invention is provided with: a first Magnetization free layer; a second magnetization free layer; a nonmagnetic layer positioned adjacent to the second magnetization free layer; and a first magnetization fixed layer positioned adjacent to the nonmagnetic layer on the side opposite to the second magnetization free layer. The first magnetization free layer is formed of ferromagnetic material and has a magnetic anisotropy in the film thickness direction. On the other hand, the second magnetization free layer and the first magnetization fixed layer are formed of ferromagnetic material and have a magnetic anisotropy in the in-plane direction. The first magnetization free layer includes first and second magnetization fixed regions, and a magnetization free region connected to the first and second magnetization fixed regions. The magnetization free region and the second magnetization free layer are magnetically coupled. In addition, the center of mass of the magnetization free region and the center of mass of the second magnetization free layer are positioned displaced in a particular in-plane direction.

In the magnetoresistive element of the present invention, in which the first magnetization free layer in which the current-driven domain wall motion occurs is made of the material having a magnetic anisotropy in the film thickness direction, the domain wall can be driven even with a small current density, due to the spin torque term in an LLG equation in view of the spin-polarized current. Here, the domain wall motion can be caused with substantially no influence by a de-pin magnetic field, and thus the current necessary for writing is decreased in the magnetoresistive element of the present invention, while the high thermal stability and the external disturbance magnetic field resistance are kept. In addition, the data stored as the direction of the magnetization of the magnetization free region in the first magnetization free layer is transmitted to the second magnetization free layer, which has a magnetic anisotropy in the in-plane direction, through the magnetic coupling between the magnetization free region and the second magnetization free layer. This allows reading by using the magnetic tunnel junction formed with the first magnetization fixed layer and the second magnetization free layer, which have magnetization components in the in-plane longitudinal direction. Thus, a high magnetoresistance ratio is obtained by properly selecting the materials of the second magnetization free layer, the nonmagnetic layer and the first magnetization fixed layer.

DESCRIPTION OF EMBODIMENTS

Configuration of Magnetoresistive Element

Figure 1A:
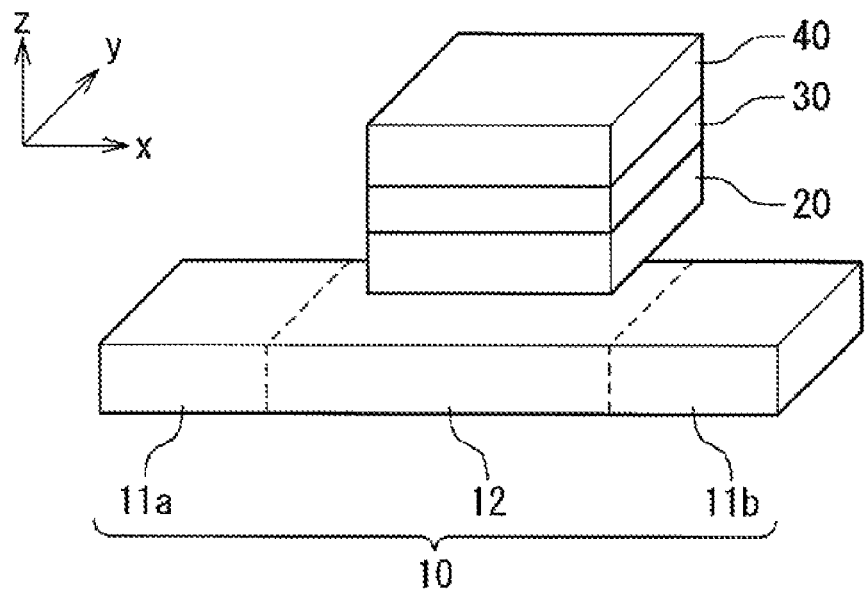
FIG. 1A is a perspective view showing the structure of the main portion of a magnetoresistive element in one embodiment of the present invention.
Figure 1B:
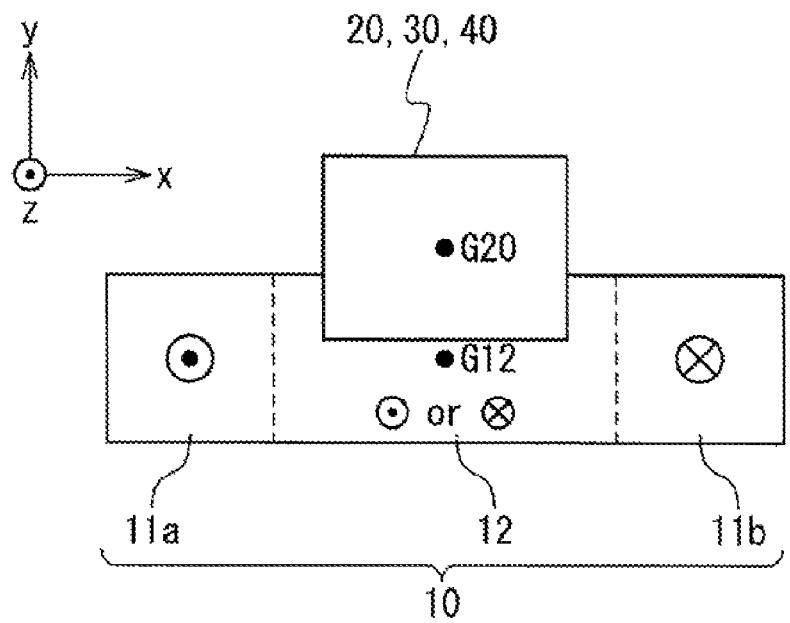
FIG. 1B is a plan view showing the structure of the main portion of the magnetoresistive element shown in FIG. 1A.
Figure 1C:
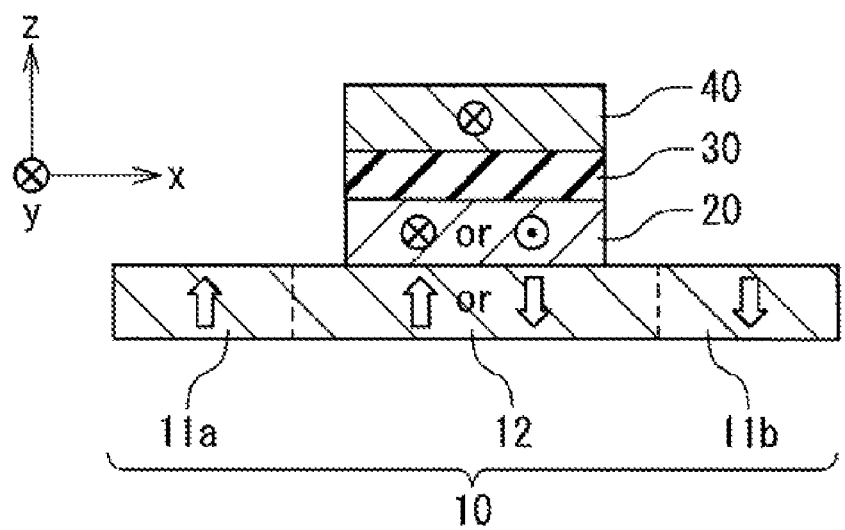
FIG. 1C is a plan view showing the structure of the main portion of the magnetoresistive element shown in FIG. 1A.
Figure 1D:
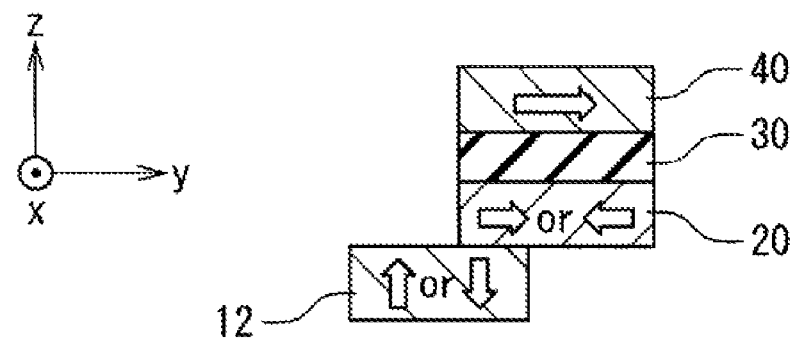
FIG. 1D is a plan view showing the structure of the main portion of the magnetoresistive element shown in FIG. 1A.

FIGS. 1A to 1D schematically show the structure of a magnetoresistive element in one embodiment of the present invention. In detail, FIG. 1A is a perspective view, and FIG. 1B, FIG. 1C and FIG. 1D are an x-y plan view, an x-z sectional view and a y-z sectional view, respectively, in the x-y-z coordinate system shown in FIG. 1A.

The magnetoresistive element in this embodiment is provided with a first magnetization free layer 10, a second magnetization free layer 20, a nonmagnetic layer 30 and a first magnetization fixed layer 40. The second magnetization free layer 20 is disposed adjacent to one surface of the nonmagnetic layer 30, and the first magnetization fixed layer 40 is disposed adjacent to the other surface of the nonmagnetic layer 30.

The first magnetization free layer 10, the second magnetization free layer 20 and the first magnetization fixed layer 40 are formed of ferromagnetic material. The first magnetization free layer 10 has a magnetic anisotropy in the film thickness direction (the z-axis direction in the figure), and the second magnetization free layer 20 and the first magnetization fixed layer 40 have a magnetic anisotropy in the in-plane direction.

In this embodiment, the nonmagnetic layer 30 is formed of insulator, and a magnetic tunnel junction (MTJ) is composed of the second magnetization free layer 20, the nonmagnetic layer 30 and the first magnetization fixed layer 40. Although being desirably formed of insulator, the nonmagnetic layer 30 may be formed of semiconductor or conductor. Although not shown in FIG. 1A to FIG. 1D, an electrode layer, a diffusion protection layer, a base layer and the like may be preferably formed depending on the necessity, in addition to the foregoing layers.

In the magnetoresistive element in this embodiment, the first magnetization free layer 10 is composed of a first magnetization fixed region 11a, a second magnetization fixed region 11b and a magnetization free region 12. The magnetization free region 12 is formed between the first and second magnetization fixed regions 11a and 11b. Also, the first magnetization free layer 10 is designed so that the magnetization free region 12 is magnetically coupled to at least a part of the second magnetization free layer 20. In other words, the first magnetization free layer 10 is designed so that the magnetization state of the magnetization free region 12 causes an influence on the magnetization state of the second magnetization free layer 20. The magnetization free region 12 is formed to be also electrically connected to the second magnetization free layer 20.

Each of the first magnetization fixed region 11a and the second magnetization fixed region 11b has a fixed magnetization in at least a portion thereof. The magnetizations of the first magnetization fixed region 11a and the second magnetization fixed region 11b are fixed in the film thickness direction (the z-axis direction in the figure), and are oriented approximately anti-parallel to each other. On the other hand, the magnetization of the magnetization free region 12 is reversible and approximately parallel to one of the magnetizations of the first and second magnetization fixed regions 11a and 11b. In the magnetoresistive element in this embodiment, the direction of the magnetization of the magnetization free region 12 corresponds to the stored data.

Also, the second magnetization free layer 20 has a reversible magnetization in the in-plane direction (the direction inside the x-y plane)), and the magnetization of the first magnetization fixed layer 40 is fixed in a predetermined direction in the in-plane direction (the direction inside the x-y plane).

As mentioned above, the magnetization free region 12 and the second magnetization free layer 20 are magnetically coupled. Preferably, the center of mass G12 of the magnetization free region 12 and the center of mass G20 of the second magnetization free layer 20 are designed to be displaced in the x-y plane. Consequently, as described later, the magnetization direction of the second magnetization free layer 20 is uniquely determined correspondingly to the magnetization direction of the magnetization free region 12. Thus, the data stored as the magnetization direction of the magnetization free region 12 is transmitted to the second magnetization free layer 20 through the magnetic coupling between the magnetization free region 12 and the second magnetization free layer 20. Although FIGS. 1A to 1D show the examples in which the center of mass G20 of the second magnetization free layer 20 is displaced in the +y direction with respect to the center of mass G12 of the magnetization free region 12, the direction in which the center of mass G20 of the second magnetization free layer 20 is displaced in the x-y plane with respect to the center of mass G12 of the magnetization free region 12 may be approximately parallel to the direction in which the magnetization of the second magnetization free layer 20 is reversible, in general. Also, the magnetization of the first magnetization fixed layer 40 is desired to be fixed in a direction approximately parallel to the direction in which the center of mass G20 of the second magnetization free layer 20 is displaced in the x-y plane with respect to the center of mass G12 of the magnetization free region 12.

It should be noted that the "center of mass" in this context means the center of mass in terms of the geometry in the x-y plane. That is, when the positional vector of the center of mass is defined as Rg=(Xg, Yg) and a positional vector of an arbitrary position is defined as Ri=(Xi, Yi), the positional vector Rg of the center of mass satisfies Σi(Ri−Rg)=0. Here, Σi means the total sum with respect to i. For a rectangle or parallelogram, for example, the center of mass is positioned at the intersection of the diagonals, and for an ellipse, the center of mass is positioned at the center thereof.

Hereinafter, the materials of the respective layers are exemplified. It should be noted that any of the materials given in this context is only one example; in practice, any material that enables the attainments of the foregoing magnetization states may be used.

First, the first magnetization free layer 10 desirably includes at least one material selected from among Fe, Co and Ni. Moreover, the inclusion of Pt and/or Pd stabilizes the vertical magnetic anisotropy. In addition thereto, doping of B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm or the like achieves such an adjustment that desired magnetic characteristics are obtained. Specifically, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co, Gd—Tb—Fe—Co and the like are exemplified. In addition, lamination of a layer including any one material selected from Fe, Co and Ni and a different layer provides a magnetic anisotropy in the vertical direction. Specifically, film stacks of Co/Pd, Co/Pt, Co/Ni, Fe/Au and the like are exemplified.

Also, the second magnetization free layer 20 and the first magnetization fixed layer 40 desirably include at least one material selected from Fe, Co and Ni. In addition thereto, doping of B, C, N, O, Al, Si, P, Ti, V, Cr, Mn, Cu, Zn, Zr, Nb, Mo, Tc, Ru, Rh, Ag, Hf, Ta, W, Re, Os, Ir, Au or the like allows such an adjustment that the desired magnetic characteristics are obtained. Specifically, Ni—Fe, Co—Fe, Fe—Co—Ni, Ni—Fe—Zr, Co—Fe—B, Co—Fe—Zr—B and the like are exemplified.

Also, the nonmagnetic layer 30 is desirably formed of insulator. Specifically, preferred materials of the nonmagnetic layer 30 include Mg—O, Al—O, Al—N, Ni—O, Hf—O and the like. It should be noted, however, that the present invention may be implemented even when semiconductor or metal material other than these materials is used as the nonmagnetic layer 30. Specifically, allowed materials of the nonmagnetic layer 30 include Cr, Al, Cu, Zn and the like.

It should be noted that material which enhances the magnetoresistance ratio, which corresponds to the S/N ratio of the read signal, is preferably selected, for the second magnetization free layer 20, the nonmagnetic layer 30 and the first magnetization fixed layer 40. For example, a Co—Fe—B/Mg—O/Co—Fe—B base MTJ is recently reported to have a very large magnetoresistance ratio around 500%. From this aspect, the second magnetization free layer 20 and the first magnetization fixed layer 40 are desirably formed of Co—Fe—B base material, and the nonmagnetic layer 30 is desirably formed of Mg—O base material.

Figure 2A:
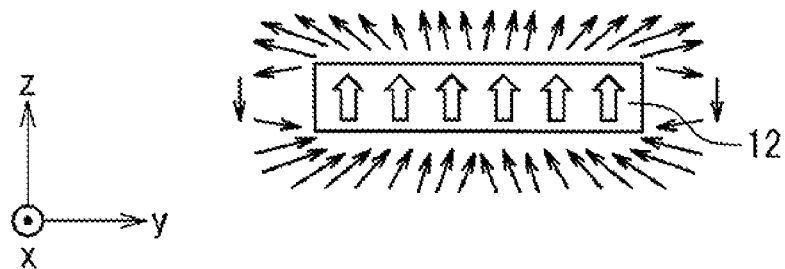
FIG. 2A is a sectional view depicting the state of the magnetic flux of the magnetoresistive element in this embodiment.

In the following, a detailed description is given of the magnetic coupling between the magnetization free region 12 and the second magnetization free layer 20, and the two states in which the magnetizations thereof are allowed in the magnetoresistive element by using FIGS. 2A to 2C. FIG. 2A is a schematic view showing the fact that the magnetization direction of the second magnetization free layer 20 is uniquely determined by the magnetization direction of the magnetization free region 12. In FIG. 2A, the magnetization of the magnetization free region 12 is assumed to be substantially oriented in one direction in the film thickness direction for simplicity. FIG. 2A schematically shows the leakage magnetic flux from the magnetization free region 12. As shown in FIG. 2A, the leakage magnetic flux is required to be smoothly tied and thus the magnetic flux exhibits an increase in the component parallel to the in-plane direction as it goes toward the end of the magnetization free region 12. The magnetization direction of the second magnetization free layer 20 is determined by the component parallel to the in-plane direction of the magnetic flux.

Figure 2B:
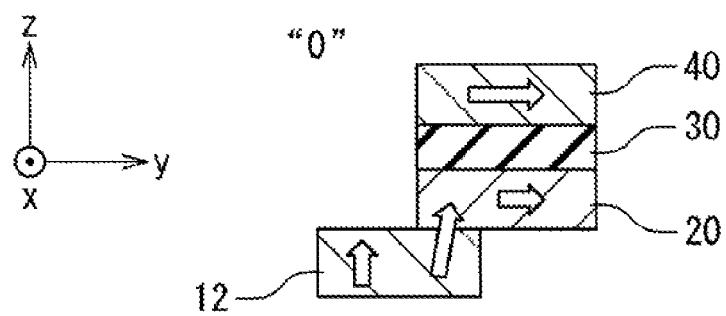
FIG. 2B is a sectional view depicting two states into which the magnetoresistive element in this embodiment is allowed to be placed.
Figure 2C:
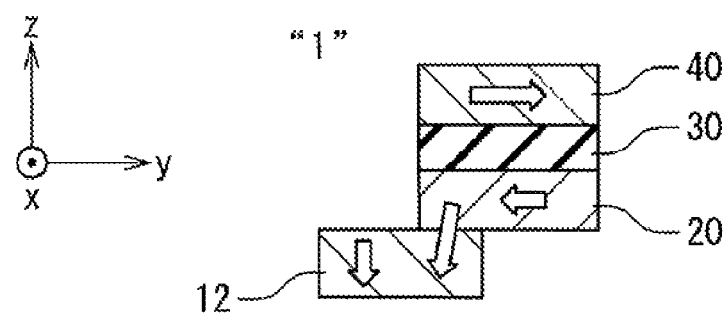
FIG. 2C is a sectional view depicting two states into which the magnetoresistive element in this embodiment is allowed to be placed.

FIGS. 2B and 2C schematically show the magnetization states of the respective layers in the "0" and "1" states in the magnetoresistive element. It should be noted that the magnetization direction of the first magnetization fixed layer 40 may be the −y direction, although FIGS. 2B and 2C show that the magnetization direction of the first magnetization fixed layer 40 is fixed in the +y direction. Here, when the magnetization of the magnetization free region 12 is oriented in the +z direction as shown in FIG. 2B, the leakage magnetic flux as shown in FIG. 2A causes the magnetization of the second magnetization free layer 20 to be oriented in the +y direction. Consequently, the magnetizations of the second magnetization free layer 20 and the first magnetization fixed layer 40 are oriented in parallel. When the magnetization of the magnetization free region 12 is oriented in the −z direction as shown in FIG. 2C, on the other hand, the leakage magnetic flux opposite to the direction in the case of FIG. 2A causes the magnetization of the second magnetization free layer 20 to be oriented in the −y direction. Consequently, the magnetizations of the second magnetization free layer 20 and the first magnetization fixed layer 40 are oriented in anti-parallel. Since the center of mass G20 of the second magnetization free layer 20 is positioned displaced in a particular direction with respect to the center of mass G12 of the magnetization free region 12 as mentioned above, the magnetization of the second magnetization free layer 20 is oriented in one of the positive and negative directions on the basis of the magnetization direction of the magnetization free region 12. This results from the fact that the in-plane direction component of the leakage magnetic flux is distributed radially from the center of mass G12 of the magnetization free region 12. Consequently, the magnetizations of the second magnetization free layer 20 and the first magnetization fixed layer 40 are allowed to be placed into one of the parallel and anti-parallel states.

One important feature of the magnetoresistive element in this embodiment is that the data stored as the magnetization component in the vertical direction in the magnetization free region 12 is transmitted to the magnetization component in the in-plane direction of the second magnetization free layer 20 by the magnetic coupling. Thus, the magnetizations of the second magnetization free layer 20 and the magnetization free region 12 may be correlated by using any type of magnetic coupling, for example, the use of the exchange coupling and the like, not limited to the method of using the leakage magnetic flux.

It should be noted that, the direction of the magnetization easy axis of the magnetization of the second magnetization free layer 20 may be arbitrarily directed, as long as the magnetization direction can be changed in response to the magnetization of the magnetization free region 12. Thus, the direction of the magnetization easy axis of the second magnetization free layer 20 may be oriented in the y-direction or in the x-direction. The case of the orientation to the y-direction results in the magnetization reversal between the magnetization easy axes, while the case of the orientation to the x-direction results in the magnetization rotation to the hard axis direction with the magnetization easy axis as a center.

Also, the magnetic anisotropy of the second magnetization free layer 20 is desired not to be excessively large. This is because an extremely large magnetic anisotropy causes difficulty in the magnetization reversal by the leakage magnetic flux from the magnetization free region 12. It should be noted that the magnetic anisotropy of the second magnetization free layer 20 may be given by a crystal magnetic anisotropy or by the shape magnetic anisotropy. Also, the second magnetization free layer 20 may be a film stack including a plurality of ferromagnetic layers. Also, a layer(s) of nonmagnetic material may be inserted between the ferromagnetic layers as long as the magnetization state is not disturbed.

(Operating Method)

A description is next given of the operating method specifically, the write and read methods, for the magnetoresistive element in this embodiment.

First, a description of the write method is given. The data writing into the magnetoresistive element in this embodiment is achieved by moving the domain wall formed within the first magnetization free layer 10. As mentioned above, the first magnetization free layer 10 contains: the first magnetization fixed region 11a and the second magnetization fixed region 11b, in which the magnetizations are fixed approximately anti-parallel to each other in the film thickness direction; and the magnetization free region 12 which is electrically connected to them. The magnetization of the magnetization free region 12 is approximately parallel to one of the first magnetization fixed region 11a and the second magnetization fixed region 11b. With the above-described restriction of the magnetization state, the domain wall is introduced into the first magnetization free layer 10. When the magnetization of the magnetization free region 12 is approximately parallel to the magnetization of the first magnetization fixed region 11a and approximately anti-parallel to the magnetization of the second magnetization fixed region 11b, for example, the domain wall is formed near the boundary between the magnetization free region 12 and the second magnetization fixed region 11b. Also, when the magnetization of the magnetization free region 12 is approximately parallel to the magnetization of the second magnetization fixed region 11b and approximately anti-parallel to the magnetization of the first magnetization fixed region 11a, the domain wall is formed near the boundary between the magnetization free region 12 and the first magnetization fixed region 11a.

The position of the formed domain wall can be moved by directly feeding a current through the first magnetization free layer 10. When the domain wall is formed near the boundary between the magnetization free region 12 and the first magnetization, fixed region 11a, for example, conduction electrons are fed from the first magnetization fixed region 11a to the magnetization free region 12 by sending a current in the direction from the magnetization free region 12 to the first magnetization fixed region 11a, to thereby move the domain wall is moved in the same direction as the flow of the conduction electrons. With the movement of the domain wall, the magnetization of the magnetization free region 12 is oriented parallel to the first magnetization fixed region 11a. Also, when the domain wall is formed near the boundary between the magnetization free region 12 and the second magnetization fixed region 11b, conduction electrons are fed from the second magnetization fixed region 11b to the magnetization free region 12 by sending a current in the direction from the magnetization free region 12 to the second magnetization fixed region 11b, to thereby move the domain wall in the same direction as the flow of the conduction electrons. With the movement of the domain wall, the magnetization of the magnetization free region 12 is oriented parallel to the second magnetization fixed region 11b. In this way, the data can be rewritten between the "0" state and the "1" state.

Actually, terminals connected to external interconnections are desirably provided for the first magnetization fixed region 11a and the second magnetization fixed region 11b, to introduce the write current as described above. In this case, the write current is sent between a first terminal connected to the first magnetization fixed region 11a and a second terminal connected to the second magnetization fixed region 11b. However, the route of the write current for writing data into the magnetoresistive element in this embodiment is not limited to this; other possible methods will be described later.

A description is next given of the reading method of the data from the magnetoresistive element in this embodiment. The magnetoresistance effect is used to read the data from the magnetoresistive element in this embodiment. Specifically, the data is read by sending the current through the nonmagnetic layer 30 between the first magnetization fixed layer 40 and the second magnetization free layer 20 and detecting the change in the resistance which depends on the relative angle between the magnetizations of the first magnetization fixed layer 40 and the second magnetization free layer 20. For example, when the magnetizations of the first magnetization fixed layer 40 and the second magnetization free layer 20 are parallel as shown in FIG. 2B, the low resistance state is generated, and when the magnetizations of the first magnetization fixed layer 40 and the second magnetization free layer 20 are anti-parallel as shown in FIG. 2C, the high resistance state is generated. The change in the resistance of the magnetoresistive element is detected as a voltage signal or a current signal, and the voltage signal or the current signal is used to judge the data stored in the magnetoresistive element.

(Circuit Configuration)

Figure 3:
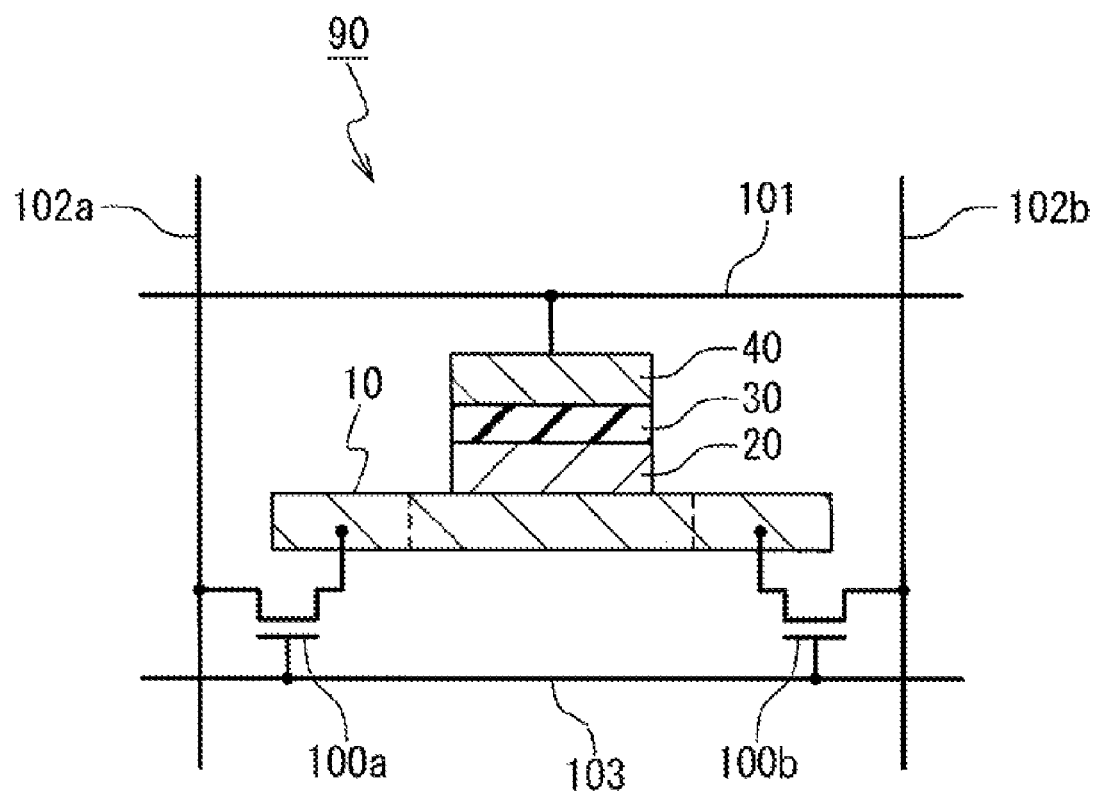
FIG. 3 is a view showing an example of the circuit configuration of a memory cell within which a magnetoresistive element of this embodiment is integrated.

Next, a description is given of the circuit configuration of an MRAM memory cell in which the magnetoresistive element in this embodiment is integrated, with reference to FIG. 3.

FIG. 3 shows a configuration example of the circuit of a memory cell 90 in which the magnetoresistive elements in this embodiment are integrated. Although FIG. 3 shows the circuit configuration of a single memory cell 90, actually, one skilled in the art would appreciate that a plurality of memory cells 90 are integrated into the MRAM, arranged in an array.

It should be noted that FIG. 3 shows an example of the circuit configuration for a case when the magnetoresistive element of this embodiment is a three-terminal element. In this case, the terminal connected to the first magnetization fixed layer 40 is connected to a read ground line 101, and on the other hand, the two terminals connected to the first magnetization free layer 10 are connected to one source/drain of different two MOS transistors 100a and 100b. Also, the other source/drain of the MOS transistors 100a, 100b are connected to write bit lines 102a and 102b, and the gate electrode is connected to a word line 103.

The writing and reading methods in the circuit shown in FIG. 3 will be described below. First, in a write operation, the word line 103 is pulled up to the "high" level to turn "ON" the MOS transistors 100a and 100b. Also, one of the bit lines 102a and 102b is pulled up to the "high" level, and the other is pulled down to the "low" level. The selection of the bit line 102 to be pulled up to the "high" level and that to be pulled down to the "low" level is determined depending on the data to be written into the magnetoresistive element, namely, the direction of the current flowing through the first magnetization free layer 10.

In a read operation, on the other hand, the word line 103 is set to "high", to turn "ON" the MOS transistors 100a and 100b. Also, one of the bit lines 102a and 102b is pulled up to the "high" level, and the other is set to "open" (floating). At this time, the reading current passing through the magnetoresistive element flows from one of the bit lines 102a and 102b to the ground line 101 through the first magnetization free layer 10, the second magnetization free layer 20, the nonmagnetic layer 30 and the first magnetization fixed layer 40. The voltage level of the bit line through which the reading current is sent, or the current level of the reading current depends on the change in the resistance of the magnetoresistive element caused by the magnetoresistance effect. High speed reading can be attained by detecting the change in the resistance as the voltage signal or the current signal.

It should be noted that the circuit configuration shown in FIG. 3 and the circuit operation described herein are only one example of the implementation of the present invention, and implementations based on another circuit configurations are also possible.

(Technical Merit of Magnetoresistive Element of this Embodiment)

The first technical advantage of the magnetoresistive element in this embodiment lies in the decrease in the write current. This results from the fact that the first magnetization free layer 10, in which the domain wall motion occurs when the data is written, has a magnetic anisotropy in the vertical direction. The inventor found out by a micro magnetic calculation using an LLG equation in which a spin transfer torque is consider that, for the domain wall in formed material having the vertical magnetic anisotropy, the current density required to be driven by a current is sufficiently reduced, and the magnetic field required to be driven by a magnetic field becomes sufficiently great, compared with the domain wall formed in material having an in-plane magnetic anisotropy. As described in Europhysics Letters, vol. 69, pp. 990-996 (2005), according to the LLG equation in which the spin transfer torque is considered, the temporal change of the magnetization ($\partial m/\partial t$) is represented as the sum of: [1] a term representing a torque caused by the magnetic field; [2] a damping term; [3] an adiabatic spin torque term; and [4] a non-adiabatic spin torque term. The micro magnetic calculation has proved that the domain wall in material having a vertical magnetic anisotropy is driven by [3] the adiabatic spin torque term even at the current density of about $1\times10^8$ [A/cm$^2$], while the domain wall in the in-plane magnetization film is not driven at the current density of about $1\times10^8$ [A/cm$^2$] unless there is an effect of [4] the non-adiabatic spin torque term. Here, it is known in the case of the domain wall drive based on [3] the adiabatic spin torque term that the domain wall can be de-pinned from the pin site independently of the pinning magnetic field, for the pinning that is not excessively large. Thus, as for the material having the vertical magnetic anisotropy in which the domain wall drive based on [3] the adiabatic spin torque term is possible, it can be concluded that both of the pinning of the strong domain wall and the domain wall drive based on the low current density are easily attained, as compared with material having an in-plane magnetic anisotropy in which the domain wall drive based on [3] the adiabatic spin torque term is impossible. That is, the use of material having a vertical magnetic anisotropy reduces the current necessary for the writing, while keeping the sufficient value as the thermal stability.

For example, as a simple example, let us consider a configuration in which the width (w) of the magnetoresistive element is 100 nm, the film thickness (t) of the first magnetization free layer 10 is 2 nm, the half of the width ($q_O$) of the pin site of the domain wall is 15 nm, the saturation magnetization ($M_S$) of the first magnetization free layer 10 is 500 [emu/cm$^3$], the spin polarizability (P) is 0.5, and the de-pin magnetic field ($H_C$) of the pin site of the domain wall is 1000 [Oe]. In this case, the thermal stability index $\Delta E/k_B T$ is about 40, where $k_B$ is the Boltzmann' constant, and T is the absolute temperature. It is concluded from the micro magnetic calculation that the current density required to de-pin the domain wall from the pin site for this configuration is about $2 \times 10^7$ [A/cm$^2$]. In this case, the write current of the element becomes 0.4 (mA).

On the other hand, as a structure to attain the same thermal stability index ($\Delta E/k_B T=40$) by using material that has a magnetic anisotropy in the in-plane direction, for example, let us consider a configuration in which the width (w) of the magnetoresistive element is 100 nm, the film thickness (t) of the magnetization free layer is 10 nm, the half of the width ($q_O$) of the pin site of the domain wall is 40 nm, the saturation magnetization ($M_S$) is 800 [emu/cm$^3$], the spin polarizability (P) is 0.7, and the de-pin magnetic field ($H_C$) of the pin site of the domain wall is 50 [Oe]. It is concluded from the micro magnetic calculation that the current density required to de-pin the domain wall from the pin site in such a configuration known to be about $6 \times 10^8$ [A/cm$^2$]. Although the use of such a high current density in the element is not originally practical from the viewpoint of the heat generation and the electromigration effect; the value of this current density is used for comparison. In this case, the write current to be fed to the element with the in-plane magnetization film is 6 [mA]. As thus discussed, it is concluded that the use of material having a magnetic anisotropy in the vertical direction the layer in which the domain wall motion occurs achieves a remarkable decrease in the write current.

It should be noted that the parameters of the magnetoresistive element used in this context are only rough examples, and the parameters of the magnetoresistive element may be variously changed. Thus, the current value necessary for the writing and the thermal stability $\Delta E/k_B T$ are changed according to changes in the parameter; however, the magnitude relation between the write currents of the in-plane magnetization film and the vertical magnetization film is not greatly overturned, since the current value and the thermal stability are changed while they are approximately associated.

Moreover, it is concluded from the micro magnetic calculation that the current density required to drive the domain wall by a current is decreased as the film thickness is reduced in material having a magnetic anisotropy in the vertical direction, differently from material having a magnetic anisotropy in the in-plane direction. As the film thickness is reduced, the total current quantity is naturally decreased, and the use of vertical magnetic anisotropy material effectively decreases the write current, since the current density is further decreased in the vertical magnetic anisotropy material.

The second technical advantage of the magnetoresistive element in this embodiment lies in the increase in the read signal. This result from the fact that the data stored in the first magnetization free layer 10, which has a vertical magnetic anisotropy, is transmitted to the second magnetization free layer 20, which has a magnetic anisotropy in the in-plane direction, and the MTJ from which data is to be read is comprised of ferromagnetic layers having a magnetization in the in-plane direction. Use of Co—Fe—B/Mg—O/Co—Fe—B base material or the like for the ferromagnetic layers within the MTJ allows achieving a further higher MR ratio.

The third technical advantage of the magnetoresistive element in this embodiment lies in the solution of the tradeoff between the write and read operations, and facilitation of the manufacture process. This results from the fact that the first magnetization free layer 10 for the writing and the second magnetization free layer 20 for the reading can be independently designed. In a case of a generally-used MRAM of a magnetic field writing type, for example, the magnetic anisotropy of the element is generally increased and the current necessary for the writing is thereby increased, when material having the high spin polarization ratio such as Co—Fe and the like is used in order to increase the read signal. However, in the magnetoresistive element in this embodiment, the decrease in the write current and the increase in the reading signal can be attained by adjusting the property of the different layer, and thus the foregoing tradeoff can be solved. In addition, the first magnetization free layer 10 and the second magnetization free layer 20 are allowed to be separately manufactured, which makes the manufacturing process easy.

The third technical advantage of the magnetoresistive element in this embodiment lies in the reduction of the cost resulting from the omission of a magnetic shield or the reduction in the requirements for the magnetic shield. This is because the vertical magnetic anisotropy material used in the first magnetization free layer 10 that serves as the data storage layer has a sufficiently large crystal magnetic anisotropy and thus the durability against the external disturbance magnetic field is extremely great as compared with the in-plane magnetization film. The use of material having a magnetic anisotropy in the in-plane direction inevitably requires a magnetic shield under actual use conditions, while the present invention does not require a magnetic field to insure the external disturbance magnetic field resistance, or even if this is required, requirements for the performance of the magnetic shield is reduced, which enables the reduction of the manufacture cost.

(First Modification)

Figure 4A:
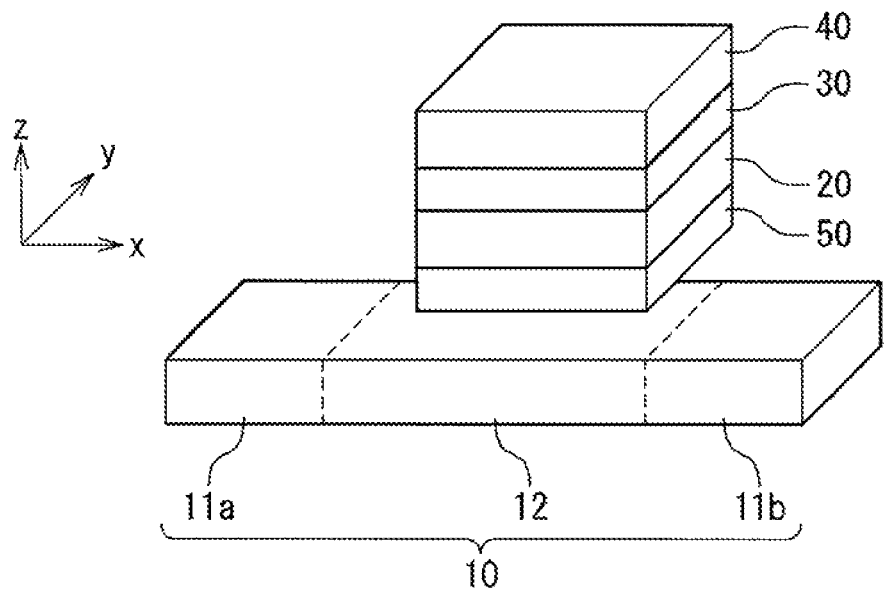
FIG. 4A is a perspective view showing a configuration of a first modification of the magnetoresistive element in this embodiment.
Figure 4B:
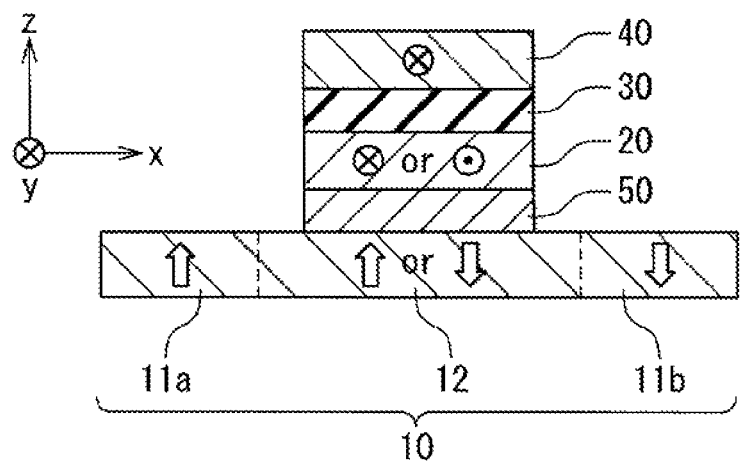
FIG. 4B is a sectional view showing the configuration of the magnetoresistive element shown in FIG. 4A.
Figure 4C:
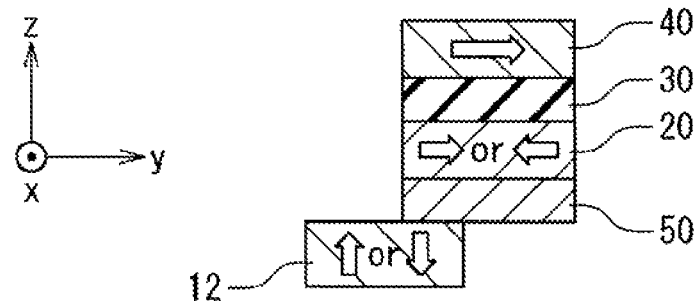
FIG. 4C is a sectional view showing the configuration of the magnetoresistive element shown in FIG. 4A.
Figure 5A:
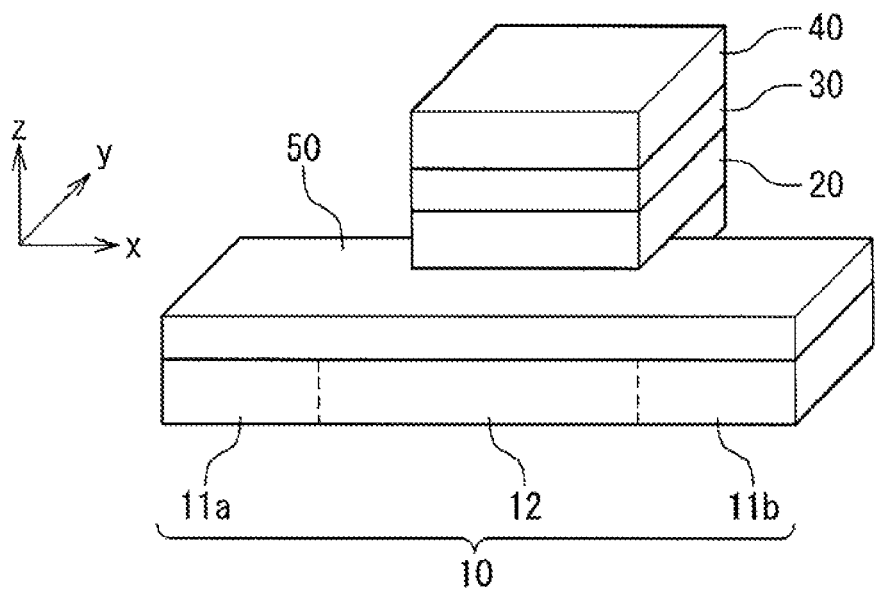
FIG. 5A is a perspective view showing another configuration of the first modification of the magnetoresistive element in this embodiment.
Figure 5B:
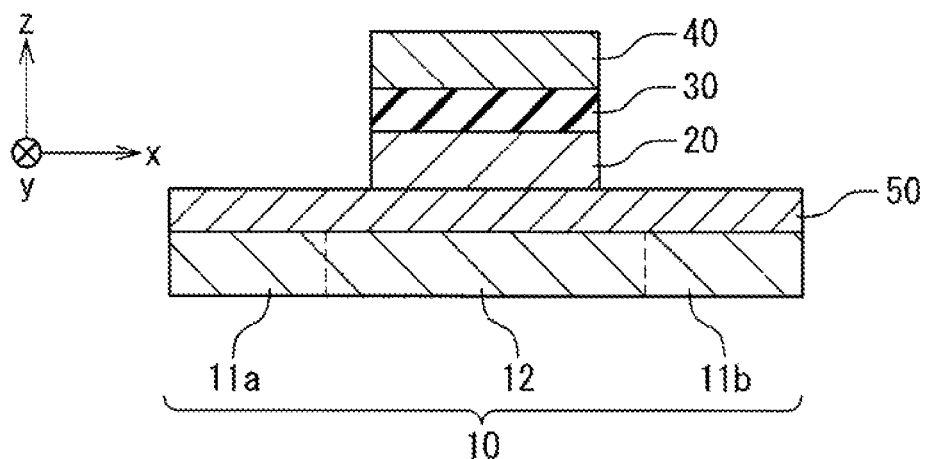
FIG. 5B is a sectional view showing the configuration of the magnetoresistive element shown in FIG. 5A.
Figure 5C:
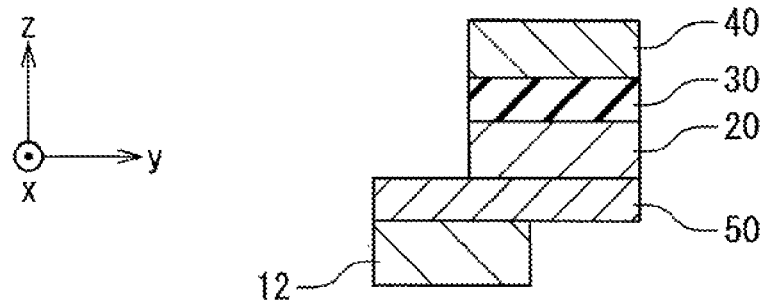
FIG. 5C is a sectional view showing the configuration of the magnetoresistive element in shown FIG. 5A.

FIG. 4A to FIG. 4C and FIG. 5A to FIG. 5C schematically show structures of a first modification of the magnetoresistive element of this embodiment. FIG. 4A to FIG. 4C show one implementation of the first modification, and FIG. 5A to 5C show another implementation. Among them, FIG. 4A, FIG. 5A are perspective views, and FIG. 4B, FIG. 5B are x-z sectional views in FIG. 4A, FIG. 5A, and FIG. 4C, FIG. 5C show y-z sectional view in FIG. 4A, FIG. 5A.

In detail, in the first modification, a conductive layer 50 is formed between the first magnetization free layer 10 and the second magnetization free layer 20. The conductive layer 50 is formed of a conductor. It should be noted that the conductive layer 50 may be magnetic or non-magnetic. When the conductive layer 50 is magnetic, the conductive layer 50 is preferably formed of relatively soft magnetic material. Also, the conductive layer 50 may be configured by the lamination film made of a plurality of materials. The conductive layer 50 also has a role for provide an electrical connection between the first magnetization free layer 10 and the second magnetization free layer 20.

As for the shape of the conductive layer 50, the conductive layer 50 may be formed only under the second magnetization free layer 20 as shown in FIG. 4A to FIG. 4C, or may be formed to entirely cover the upper surface of the first magnetization free layer 10 and the lower surface of the second magnetization free layer 20 as shown in FIG. 5A to FIG. 5C.

Also, although not shown in the drawings, the conductive layer 50 may be formed to cover only at least portions of the second magnetization free layer 20 and the first magnetization free layer 10.

The formation of the conductive layer 50 facilitates the manufacturing process. This is because the upper and lower portions of the conductive layer 50 can be separately formed. Here, the conductive layer 50 can serve as a cap layer of a layer under the conductive layer 50 and serve as a base layer of the layer on the conductive layer 50. This avoids the oxidization and chemical deterioration of the layer under the conductive layer 50, and provides control of the crystal orientation and protection from the chemical deterioration for the layer on the conductive layer 50. Also, the formation of the conductive layer 50 provides an improved electrical connection between the first magnetization free layer 10 and the second magnetization free layer 20.

Also, when magnetic material is used for the conductive layer 50, the data of the magnetization of the magnetization free region 12 in the first magnetization free layer 10 can be efficiently transmitted to the second magnetization free layer 20. To do so, material having a high magnetic permeability is desired to be used for the conductive layer 50. This allows reversing the magnetization of the second magnetization free layer 20 more easily. In order to efficiently transmit the data of the magnetization of the magnetization free region 12 to the second magnetization free layer 20 by using the conductive layer 50, the material of the conductive layer 50 desirably includes at least one element of Fe, Co and Ni.

(Second Modification)

FIGS. 6A to 6C, FIGS. 7A to 7C, and FIGS. 8A to 8C schematically show structures of the second modification of the magnetoresistive element in this embodiment. The second modification relates to the positional relation between the first magnetization free layer 10 and the second magnetization free layer 20.

Figure 6A:
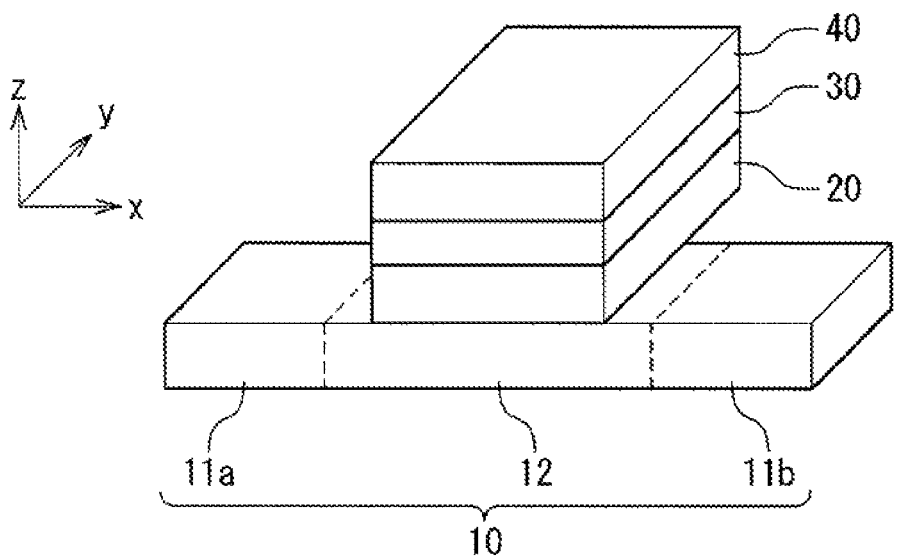
FIG. 6A is a perspective view showing a configuration of a second modification of the magnetoresistive element in this embodiment.
Figure 6B:
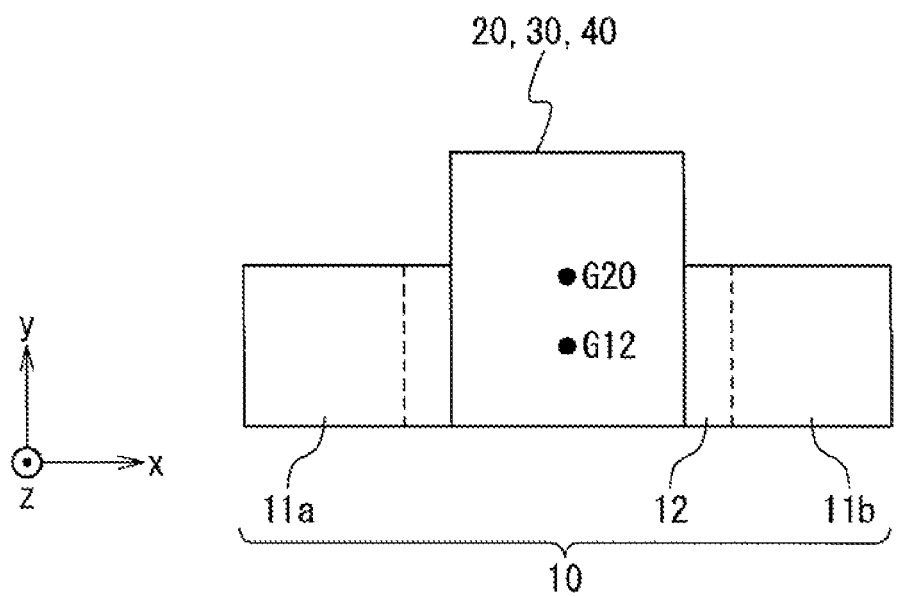
FIG. 6B is a plan view showing the configuration of the magnetoresistive element shown in FIG. 6A.
Figure 6C:
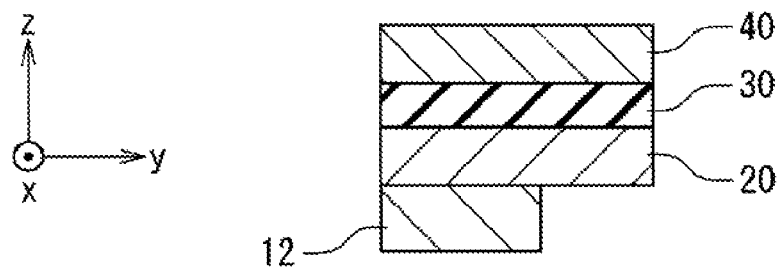
FIG. 6C is a sectional view showing the configuration of the magnetoresistive element shown in FIG. 6A.
Figure 7A:
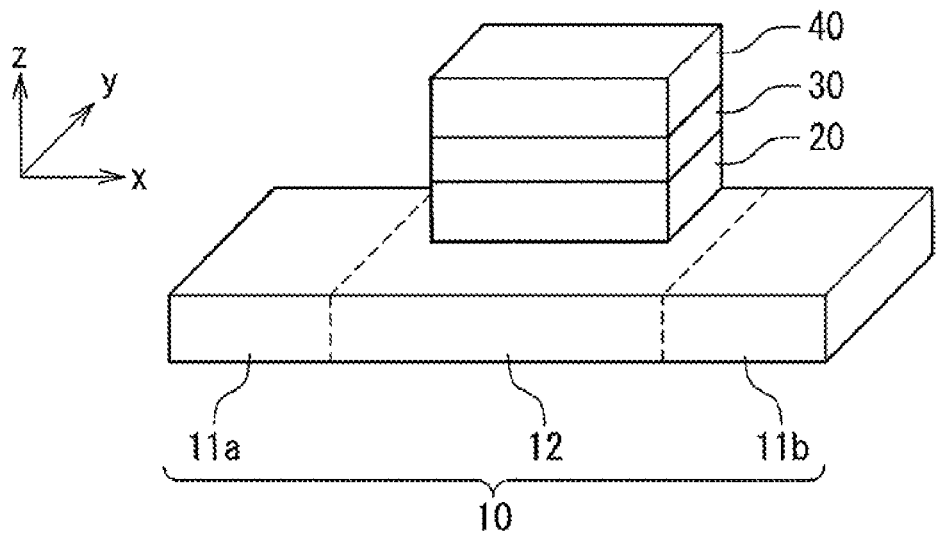
FIG. 7A is a perspective view showing another configuration of the second modification of the magnetoresistive element in this embodiment.
Figure 7B:
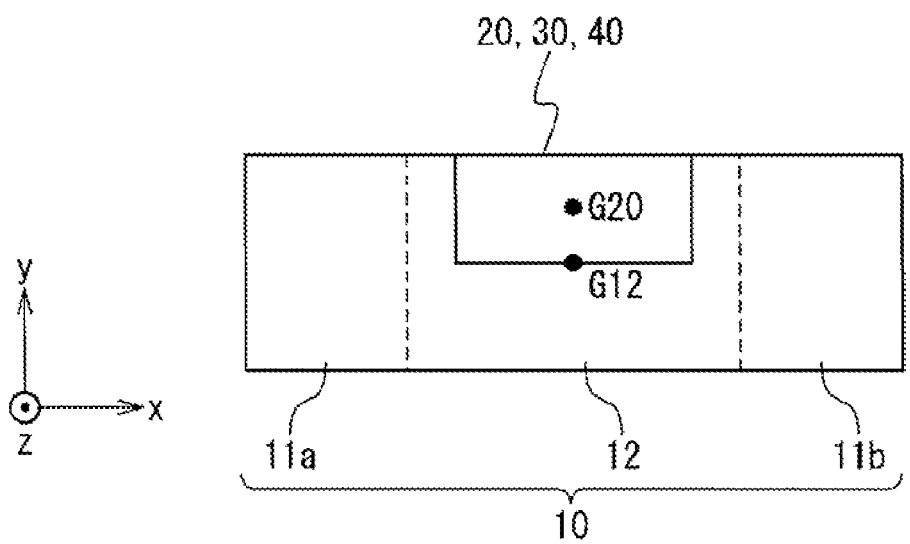
FIG. 7B is a plan view showing the configuration of the magnetoresistive element shown in FIG. 7A.
Figure 7C:
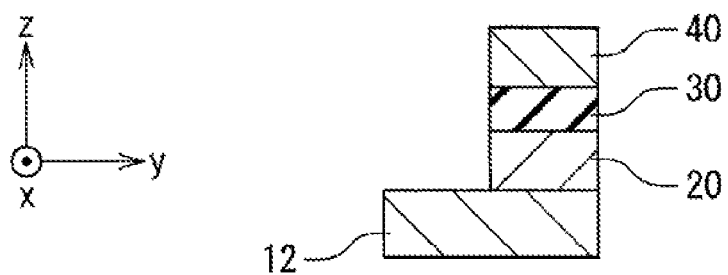
FIG. 7C is a sectional view showing the configuration of the magnetoresistive element shown in FIG. 7A.
Figure 8A:
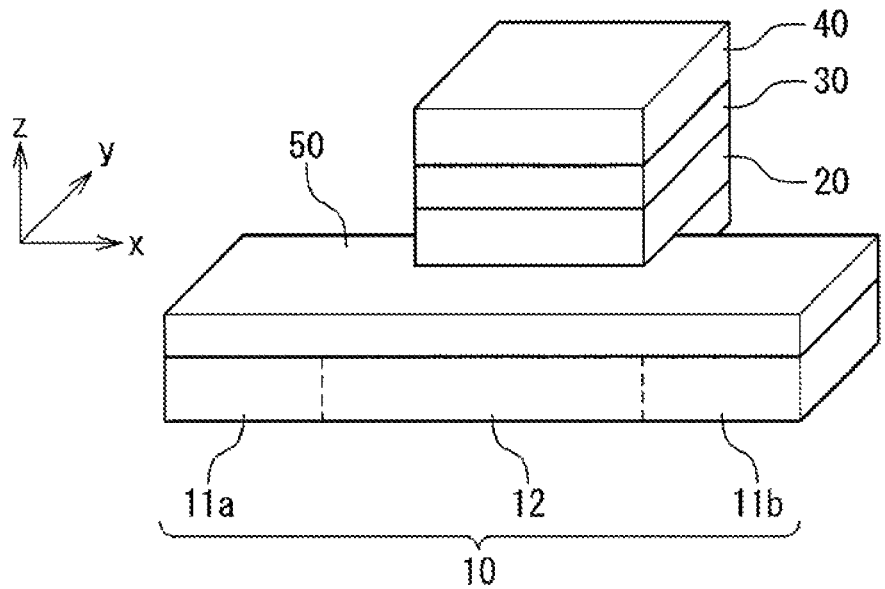
FIG. 8A is a perspective view showing still another configuration of the second modification of the magnetoresistive element in this embodiment.
Figure 8B:
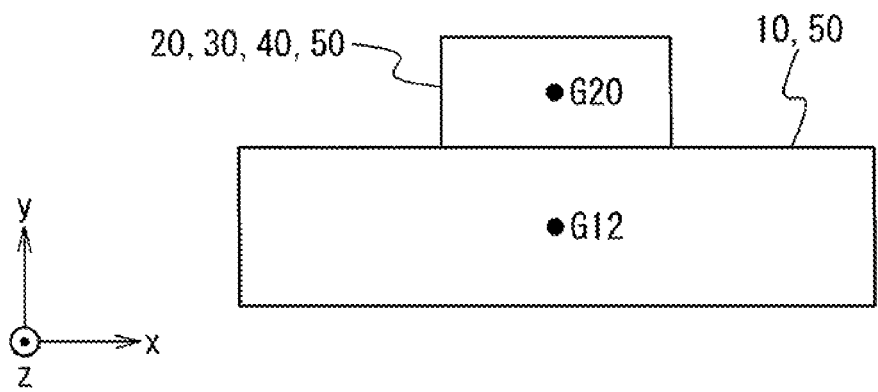
FIG. 8B is a plan view showing the configuration of the magnetoresistive element shown in FIG. 8A.
Figure 8C:
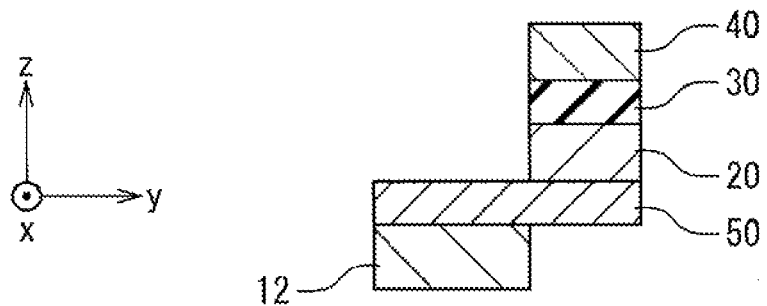
FIG. 8C is a sectional view showing the configuration of the magnetoresistive element shown in FIG. 8A.

One feature of the magnetoresistive element in this embodiment lies in the arrangement in which the center of mass G20 of the second magnetization free layer 20 is disposed displaced in the in-plane direction (namely, the direction parallel to the x-y plane), with respect to the center of mass G12 of the magnetization free region 12 in the first magnetization free layer 10, and the positional and size relations may be variously changed. Thus, various structures as well as the structures shown in FIG. 1A to FIG. 1D may be used for the magnetoresistive element in this embodiment. FIGS. 6A, 7A and 8A are perspective views of the respective structures, and FIGS. 6B, 7B and 8B are the x-y plan views, and FIGS. 6C, 7C and 8C are the y-z sectional views. It should be noted that, in all of these structures, the center of mass G20 of the second magnetization free layer 20 is disposed displaced in the +y direction in the x-y plane with respect to the center of mass G12 of the magnetization free region 12. Here, FIGS. 6A to 6C show an example in which the second magnetization free layer 20 is disposed to cross the magnetization free region 12, and FIGS. 7A to 7C show an example in which the second magnetization free layer 20 is accommodated in the x-y plane within the magnetization free region 12. Also, FIGS. 8A to 8C show an example in which the second magnetization free layer 20 and the magnetization free region 12 are electrically connected through the conductive layer 50 without overlapping in the x-y plane. In all of the cases, the magnetization direction of the second magnetization free layer 20 can be determined in accordance with the magnetization direction of the magnetization free region 12$t$ on the basis of the principle described by using FIGS. 2A to 2C.

The configuration to be used can be properly selected by considering the balance with the manufacturing process. Also, by properly adjusting the positional and size relations between the magnetization free region 12 and the second magnetization free layer 20, it is possible to further optimize the transmission of the magnetization direction to the second magnetization free layer 20 from the magnetization free region 12.

(Third Modification)

Figure 9A:
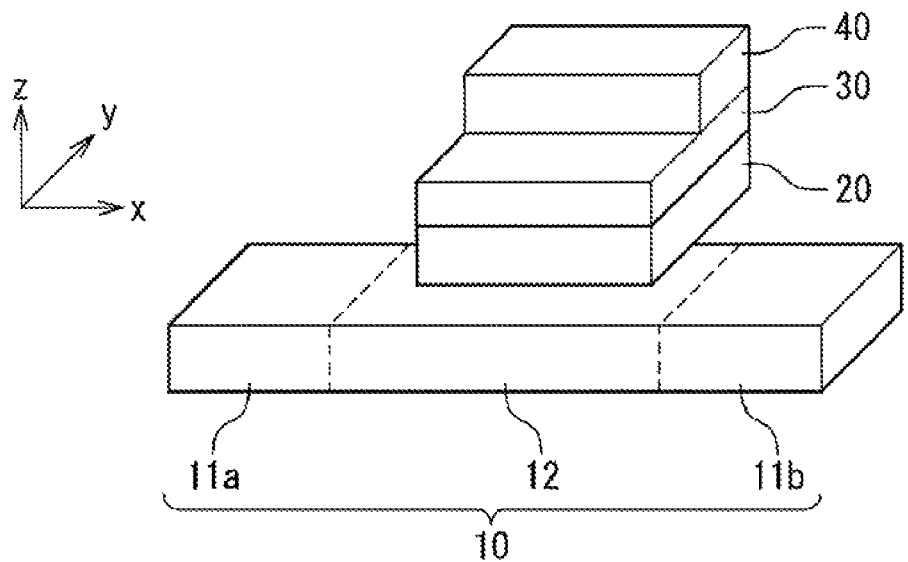
FIG. 9A is a perspective view showing a configuration of a third modification of the magnetoresistive element in this embodiment.
Figure 9B:
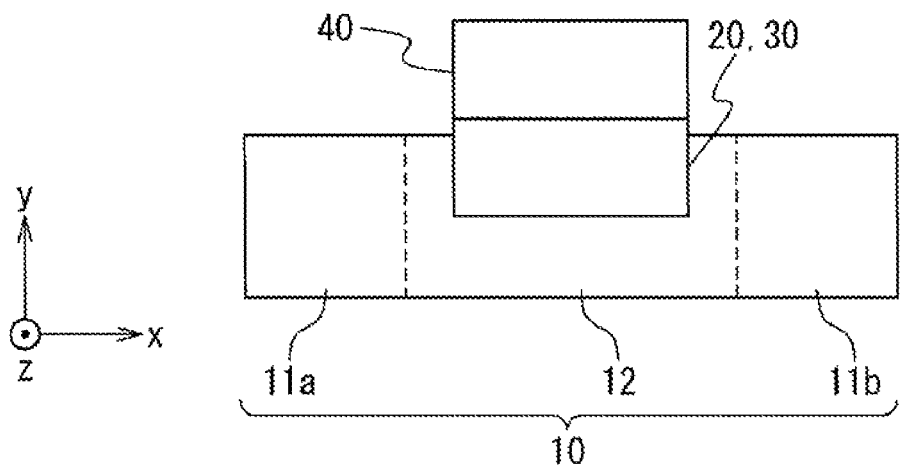
FIG. 9B is a plan view showing the configuration of the third modification of the magnetoresistive element shown in FIG. 9A.
Figure 9C:
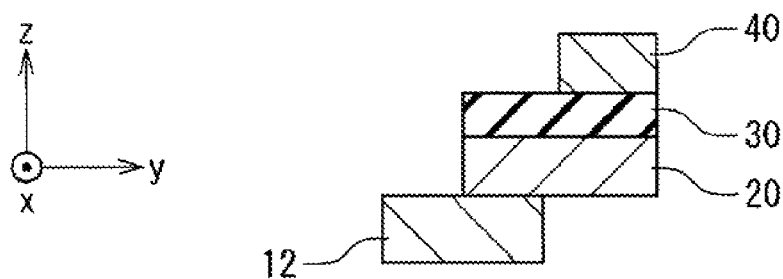
FIG. 9C is a sectional view showing the configuration of the third modification of the magnetoresistive element shown in FIG. 9A.

FIGS. 9A to 9C schematically show the structure of the third modification of the magnetoresistive element in this embodiment. The third modification relates to the positional and size relations between the second magnetization free layer 20 and the first magnetization fixed layer 40.

In the magnetoresistive element in this embodiment, the second magnetization free layer 20 and the first magnetization fixed layer 40 may at least partially overlap with each other in the x-y plane; the positional and size relations are arbitrary. Thus, the structure shown in FIGS. 9A to 9C as well as the structure shown in FIG. 1A to FIG. 1D may be used in the magnetoresistive element in this embodiment. FIG. 9A is the perspective view of the magnetoresistive element in the third modification, FIG. 9B is the x-y plan view, and FIG. 9C is the y-z sectional view. FIGS. 9A to 9C show an example in which the first magnetization fixed layer 40 is formed to overlap with a part of the second magnetization free layer 20. Depending on the magnetic properties of the magnetization free region 12 and the second magnetization free layer 20 and the magnitude of the magnetic coupling between them, there is a possibility that the disturbance in the magnetization state is generated in the part inside the second magnetization free layer 20. In this case, the first magnetization fixed layer 40 is formed to overlap with only the region in which the magnetization state of the second magnetization free layer 20 is unlikely to be disturbed so that the high reading signal can be obtained.

Also, although the drawings show the case in which the first magnetization fixed layer 40 is smaller than the second magnetization free layer 20, the first magnetization fixed layer 40 may be larger than the second magnetization free layer 20.

(Fourth Modification)

Figure 10A:
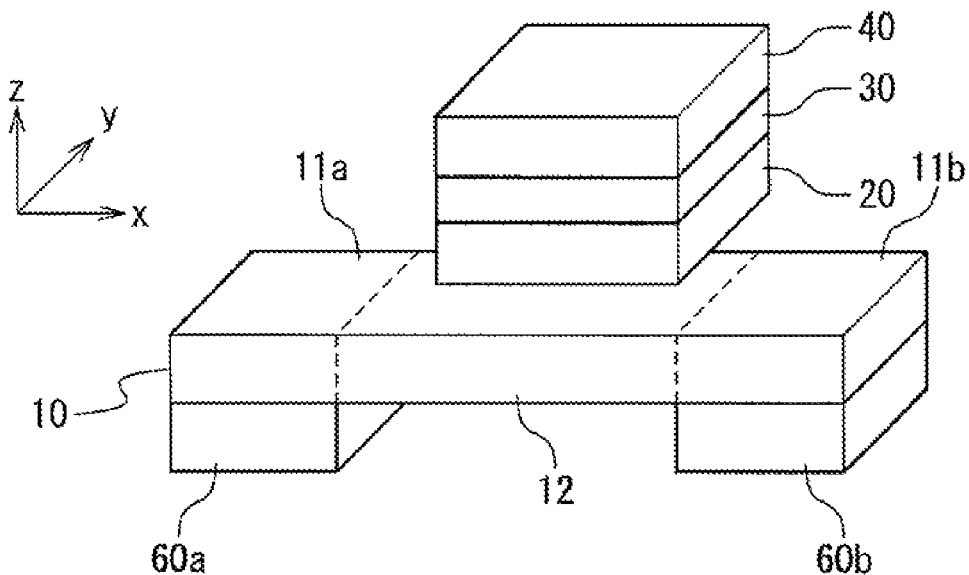
FIG. 10A is a perspective view showing a configuration of a fourth modification of the magnetoresistive element in this embodiment.
Figure 10B:
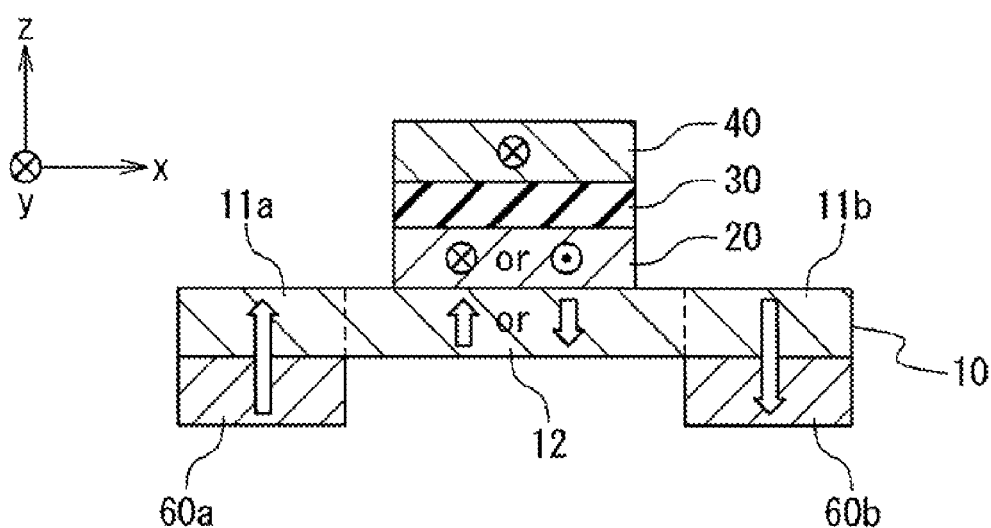
FIG. 10B is a sectional view showing the configuration of the fourth modification of the magnetoresistive element shown in FIG. 10A.
Figure 11A:
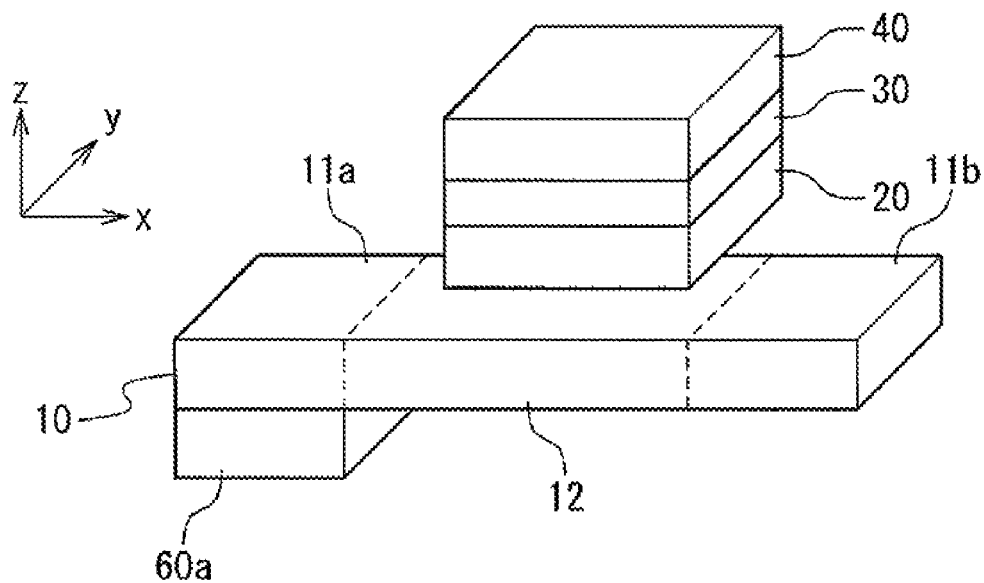
FIG. 11A is a perspective view showing another configuration of the fourth modification of the magnetoresistive element in this embodiment.
Figure 11B:
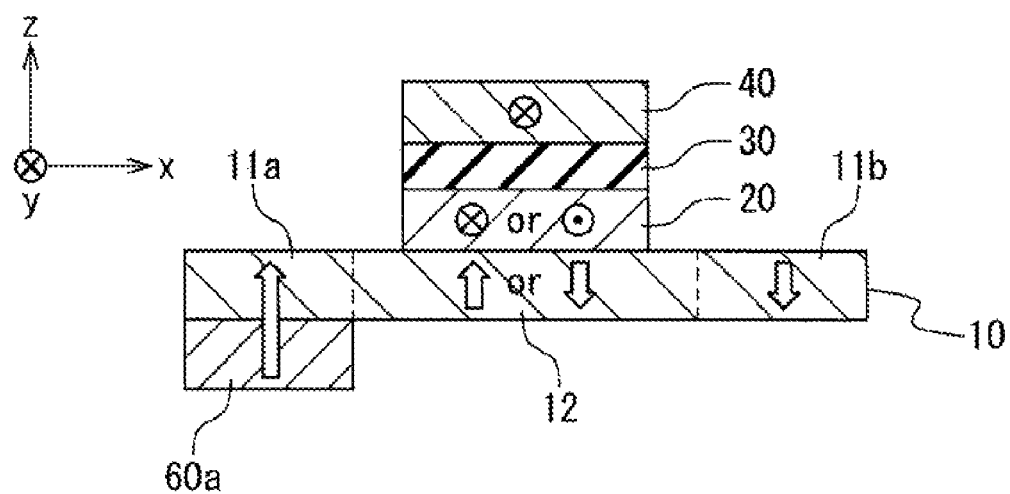
FIG. 11B is a sectional view showing another configuration of the fourth modification of the magnetoresistive element shown in FIG. 11A.

FIGS. 10A, 10B, 11A and 11B schematically show structures of the fourth modification of the magnetoresistive element of this embodiment. In the fourth modification, a second magnetization fixed layer 60$a$ and/or a third magnetization fixed layer 60$b$ is additionally disposed. Among them, FIGS. 10A and 10B show a structure in which both of the second magnetization fixed layer 60$a$ and the third magnetization fixed layer 60$b$ are disposed, and FIGS. 11A and 11B show a structure in which only the second magnetization fixed layer 60$a$ is disposed. FIGS. 10A and 11A show the perspective views, and FIGS. 10B and 11B show the x-z sectional views. It should be noted that examples of the magnetization directions of the respective layers are indicated by arrows in the sectional views of FIG. 10B and FIG. 11B.

The second magnetization fixed layer 60$a$ and the third magnetization fixed layer 60$b$ are formed to be magnetically coupled with the first magnetization free layer 10. Preferably, the second magnetization fixed layer 60$a$ is formed to be magnetically coupled to at least a part of the first magnetization fixed region 11$a$ in the first magnetization free layer 10, and the third magnetization fixed layer 60$b$ is formed to be magnetically coupled to at least a part of the second magnetization fixed region 11$b$ in the first magnetization free layer 10. The formations of the second magnetization fixed layer 60$a$ and the third magnetization fixed layer 60$b$ enable the fixed magnetization of the first magnetization free layer 10 to be stabilized and the magnetization state of the first magnetization free layer 10 to be easily initialized. The initializing method of the first magnetization free layer 10 will be simply described below.

At first, a description is given of a case in which both of the second magnetization fixed layer 60a and the third magnetization fixed layer 60b are formed as shown in FIG. 10A and FIG. 11B. In this case, the initialization can be performed by using the following two methods.

In the first method, a difference is set for the coercive forces in the film thickness direction (z-directions) of the second magnetization fixed layer 60a and the third magnetization fixed layer 60b. When the difference of the magnetic coercive force is set between the second magnetization fixed layer 60a and the third magnetization fixed layer 60b, the initialization can be performed by applying the magnetic fields in the film thickness direction in two steps. Let us consider a case that the coercive force of the second magnetization fixed layer 60a is Hca, and the coercive force of the third magnetization fixed layer 60b is Hcb, and it holds Hca>Hcb, for example. Here, the magnetic coercive force Hc0 of the first magnetization free layer 10 is assumed to satisfy: Hcb>Hc0. In this case, when an external magnetic field Hext that satisfies Hext>Hca is firstly applied in the thickness direction (the +z direction in the drawings), all of the magnetizations of the first magnetization free layer 10, the second magnetization fixed layer 60a and the third magnetization fixed layer 60b are saturated in the +z direction. This is followed by applying an external magnetic field Hext that satisfies Hca>Hext>Hcb in the −z direction. At this moment, the magnetization reversal does not occur in the second magnetization fixed layer 60a. Thus, the magnetization of the first magnetization fixed region 11a, which is magnetically coupled to the second magnetization fixed layer 60a, is not reversed. Then, in the other portions, the magnetization reversal caused by the Hext occurs. Hence, the domain wall can be introduced into the boundary between the first magnetization fixed region 11a and the magnetization free region 12.

The difference of the magnetic coercive force in the film thickness direction can be attained by using, for example, the following methods:

(1) Use materials in which their configuration elements and compositions are different.
(2) Use materials in which the directions and magnitudes of the magnetization easy axes are different.
(3) Differentiate the film thicknesses.
(4) Form an additional layer adjacent to one second magnetization fixed layer.
(5) Patten into different sizes and shapes.
These five methods may be combined.

In the second method, on the other hand, the initialization is performed by the magnetic field in the in-plane direction, differently from the first method, in which the initialization is achieved by using the magnetic field in the film thickness direction. Specifically, a sufficiently large is applied to the second magnetization fixed layer 60a, the third magnetization fixed layer 60b and the first magnetization free layer 10 in the in-plane direction to saturate the magnetizations thereof. After that, when the external magnetic field is reduced, the magnetizations are relaxed in the second magnetization fixed layer 60a, the third magnetization fixed layer 60b and the first magnetization free layer 10; at this time, by properly designing the positional relation between the respective layers, it is possible to introduce the domain wall into the first magnetization free layer 10 and fix the magnetizations of the first magnetization fixed region 11a and the second magnetization fixed region 11b to desired directions.

It should be noted that, in the second method, the magnetic anisotropies of the second magnetization fixed layer 60a and the third magnetization fixed layer 60b may be the thickness direction or the in-plane direction. Also, the properties of the second magnetization fixed layer 60a and the third magnetization fixed layer 60b are not required to be different, which allows manufacturing them in the same process.

It should be noted that, although the magnetization fixed layers (namely, the second magnetization fixed layer 60a and the third magnetization fixed layer 60b) are formed for the first magnetization fixed region 11a and the second magnetization fixed region 11b, respectively, in FIGS. 10A and 10B, a plurality of magnetization fixed layers may be formed for the first magnetization fixed region 11a. Similarly, a plurality of magnetization fixed layers may be formed for the second magnetization fixed region 11b.

The initialization method for the case when only one second magnetization fixed layer 60a is formed as shown in FIGS. 11A FIG. 11B will be described below. In this case, the second magnetization fixed layer 60a may be formed of material having a magnetic anisotropy in the thickness direction or may be formed of material having a magnetic anisotropy in the in-plane direction. The initialization method for the case when only one second magnetization fixed layer 60a is formed as shown in FIGS. 11A FIG. 11B is essentially identical to that in the first method in which the second magnetization fixed layer 60a and the third magnetization fixed layer 60b are formed to have different coercive forces, as shown in FIGS. 10A and 10B. That is, when the second magnetization fixed layer 60a is assumed to be adjacent to the first magnetization fixed region 11a and the coercive force of the second magnetization fixed layer 60a is larger than that of the first magnetization free layer 10 as shown in FIG. 11A, the coercive force of the first magnetization fixed region 11a is virtually larger than that of the second magnetization fixed region 11b. Thus, by applying the magnetic field in two steps, it is possible to carry out the initialization as mentioned above.

It should be noted that, for all of the structures in FIGS. 10A and 10B and FIGS. 11A and 11B, the positions of the second magnetization fixed layer 60a and the third magnetization fixed layer 60b with respect to the first magnetization free layer 10 are arbitrary. Thus, although the second magnetization fixed layer 60a and the third magnetization fixed layer 60b are formed on the side opposite to the second magnetization free layer 20 with respect to the first magnetization free layer 10 in FIGS. 10A, 10B, 11A and 11B, they may be formed on the same side. Also, the second magnetization fixed layer 60a and the third magnetization fixed layer 60b may be only magnetically coupled to the first magnetization free layer 10, while being spatially separated.

Also, although the circuit configuration in FIG. 3 is shown as an example in which the first magnetization free layer 10 is connected to an external interconnection, the second magnetization fixed layer 60a and the third magnetization fixed layer 60b may be formed on this route. That the second magnetization fixed layer 60a and the third magnetization fixed layer 60b may be electrically connected and formed on the first magnetization free layer 10, and terminals connected to the external interconnections may be formed on the second magnetization fixed layer 60a and the third magnetization fixed layer 60b.

(Fifth Modification)

FIGS. 12A to 12F schematically show structures of the fifth modification of the magnetoresistive element in this embodiment. The fifth modification relates to the shape of the first magnetization free layer 10.

Figure 12A:
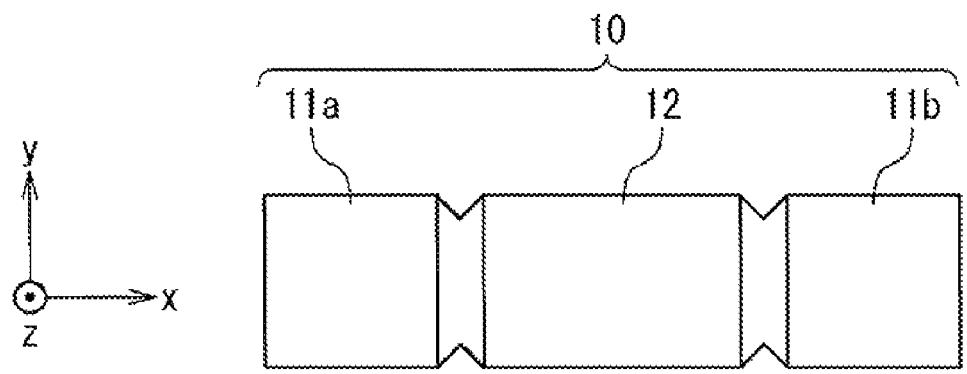
FIG. 12A is a plan view showing a configuration of a fifth modification of the magnetoresistive element in this embodiment.
Figure 12B:
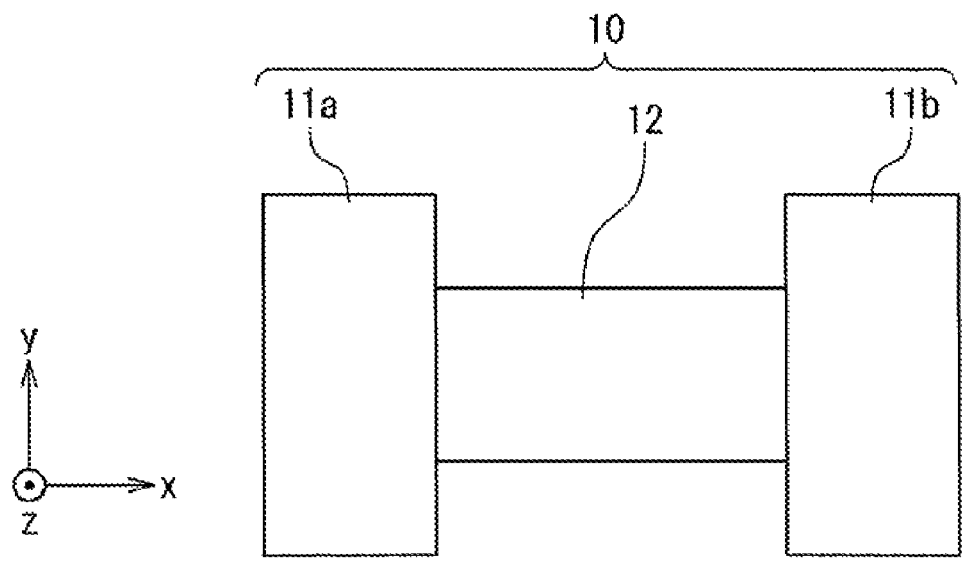
FIG. 12B is a plan view showing another configuration of the fifth modification of the magnetoresistive element in this embodiment.

There is flexibility in the shape of the first magnetization free layer 10 in the magnetoresistive element of this embodiment. As shown in the x-y plan views of FIG. 12A and FIG. 12B, for example, a change may be given in the shape to intentionally introduce pin sites of the domain wall. FIG. 12A shows an example in which a notches (or concavities) are formed as the pin sites of the domain wall. In FIG. 12A, the notches are formed in the boundary portion between the first magnetization fixed region 11a and the magnetization free region 12 and the boundary portion between the second magnetization fixed region 11b and the magnetization free region 12. Also, FIG. 12B shows an example in which the first magnetization free layer 10 is patterned to the shape of an H character. In the structure of FIG. 12B, the first magnetization free layer 10 is formed such that the widths in the y-axis directions of the first magnetization fixed region 11a and the second magnetization fixed region 11b are wider than that of the magnetization free region 12. In this case, the fact that the junctions of three elements of the H character serves as the pin sites of the domain wall is confirmed from a micro magnetic simulation. Also, as shown in FIG. 12B, the change in the width allows stopping the domain wall at desired positions due to the change in the current density, when the writing is carried out.

Figure 12C:
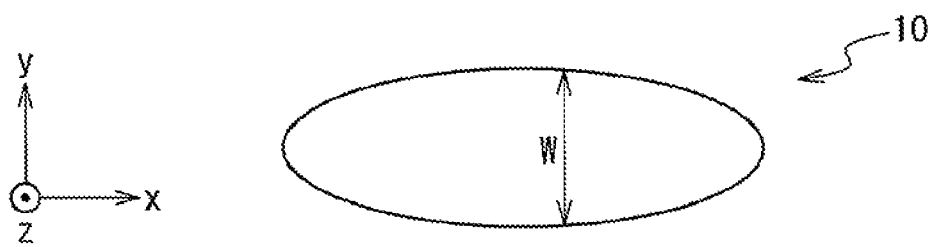
FIG. 12C is a plan view showing still another configuration of the fifth modification of the magnetoresistive element in this embodiment.
Figure 12D:
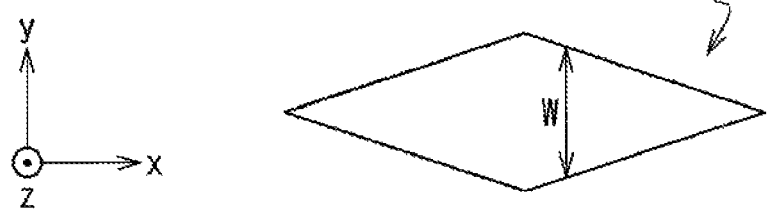
FIG. 12D is a plan view showing still another configuration of the fifth modification of the magnetoresistive element in this embodiment.
Figure 12E:
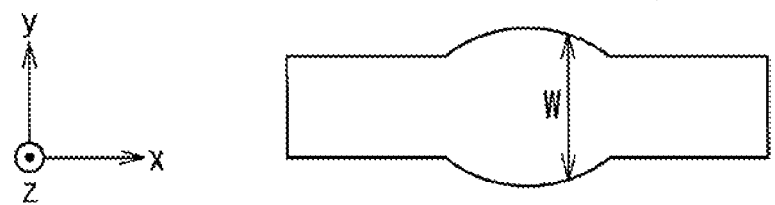
FIG. 12E is a plan view showing still another configuration of the fifth modification of the magnetoresistive element in this embodiment.

Also, the increase in the width at the center of the first magnetization free layer 10, as shown in the plan views of FIG. 12C to FIG. 12E, makes it difficult for the domain wall to be stopped at the center (namely, the magnetization free region 12). These structures achieve a stable operation.

Figure 12F:
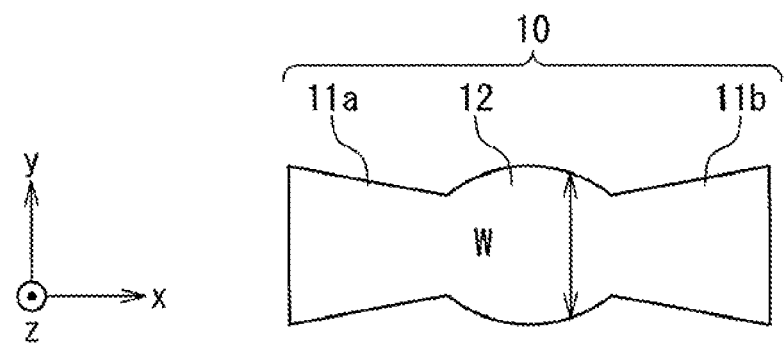
FIG. 12F is a plan view showing still another configuration of the fifth modification of the magnetoresistive element in this embodiment.

In addition, as shown in FIG. 12F, the first magnetization free layer 10 may be formed such that the width W of the first magnetization free layer 10 is once reduced as it goes from the center to both ends from the center of the first magnetization free layer 10, and then gradually increased as it goes towards both the ends. In such a shape, the pin sites are formed at the positions at which the width W of the first magnetization free layer 10 is minimum; the positions at which the width W of the first magnetization free layer 10 is minimum serve as the boundary between the first magnetization fixed region 11a and the magnetization free region 12 and the boundary between the second magnetization fixed region 11b and the magnetization free region 12. The width of the magnetization free region 12 is monotonously non-increasing, as it goes toward both the ends of the first magnetization free layer 10. On the other hand, the widths of the first magnetization fixed region 11a and the second magnetization fixed region 11b are monotonously non-decreasing, as it goes towards both the ends of the first magnetization free layer 10.

Figure 13A:
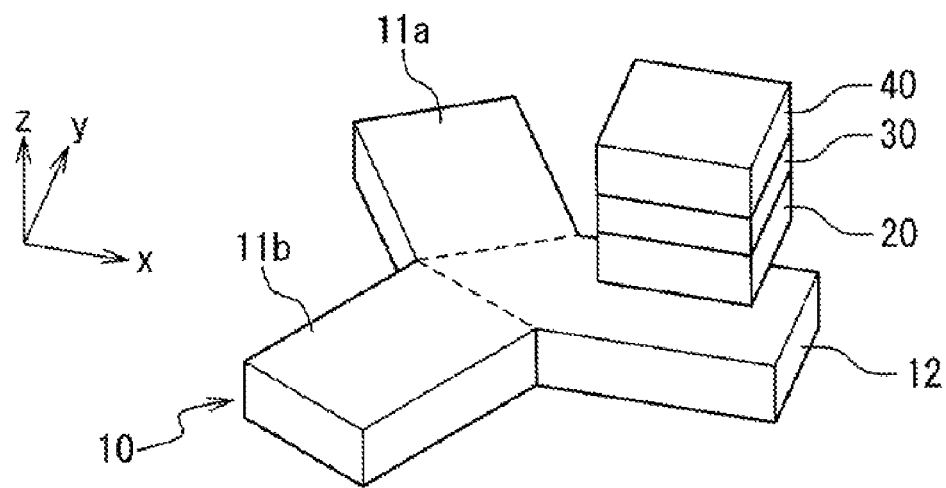
FIG. 13A is a perspective view showing still another configuration of the fifth modification of the magnetoresistive element in this embodiment.
Figure 13B:
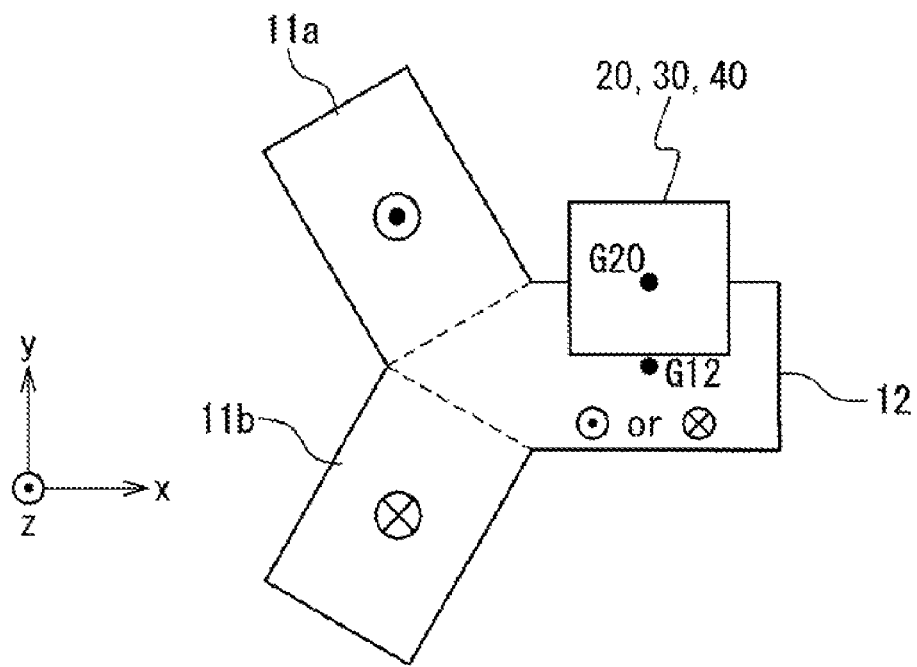
FIG. 13B is a plan view showing the configuration of the magnetoresistive element in FIG. 13A.

Also, FIGS. 13A and 13B show another structure of the fifth modification. FIG. 13A is a perspective view, and FIG. 13B is an x-y plan view, and FIGS. 13C and 13D show two examples of the circuit configuration that is employed when the magnetoresistive element has the configuration of FIGS. 13A and 13B.

Also in the structure of FIGS. 13A and 13B, the first magnetization free layer 10 is provided with the first magnetization fixed region 11a, the second magnetization fixed region 11b and the magnetization free region 12; however, the first magnetization fixed region 11a and the second magnetization fixed region 11b are connected to one end of the magnetization free region 12, differently from the configuration of FIGS. 1A to 1D, in which the first magnetization fixed region 11a is connected to one end of the magnetization free region 12 and the second magnetization fixed region 11b is connected to the other end. That is, the first magnetization fixed region 11a, the second magnetization fixed region 11b and the magnetization free region 12 form the junction of three elements. It should be noted that the positional relation between the respective layers and the magnetic properties in the structure of FIGS. 13A and 13B are as mentioned above. That is, the first magnetization free layer 10 has a magnetic anisotropy in the thickness direction, and on the other hand, the second magnetization free layer 20 and the first magnetization fixed layer 40 have a magnetic anisotropy in the in-plane direction. Also, the center of mass G20 of the second magnetization free layer 20 is disposed displaced from the center of mass G12 of the magnetization free region 12 inside the x-y plane. Also, the magnetizations of the first magnetization fixed region 11a and the second magnetization fixed region 11b that configure the first magnetization free layer 10 are fixed to the anti-parallel direction to each other in the thickness direction. It should be noted that, as discussed in the fourth modification, the second magnetization fixed layer 60a and/or the third magnetization fixed layer 60b may be formed to be magnetically coupled to the first magnetization free layer 10 in the structure of FIGS. 13A and 13B.

The magnetoresistive element of the structure shown in FIGS. 13A and 13B is a four-terminal element. One of the four terminals is disposed on the first magnetization fixed layer 40, the other two terminals are disposed on the first magnetization fixed region 11a and the second magnetization fixed region 11b, and the remaining one terminal is disposed on the magnetization free region 12. Also in the structure of FIG. 13A and FIG. 13B, the domain wall is formed in the vicinity of one of the boundary between the first magnetization fixed region 11a and the magnetization free region 12 and the boundary between the second magnetization fixed region 11b and the magnetization free region 12. Also in the structure of FIG. 13A and FIG. 13B, the writing is performed by sending a current between the first magnetization fixed region 11a and the magnetization free region 12 or between the second magnetization fixed region 11b and the magnetization free region 12. In this case, the writing results in that the domain wall starts to move from the boundary between the first magnetization fixed region 11a or the second magnetization fixed region 11b and the magnetization free region 12 and goes out from the other end of the magnetization free region 12.

Figure 13C:
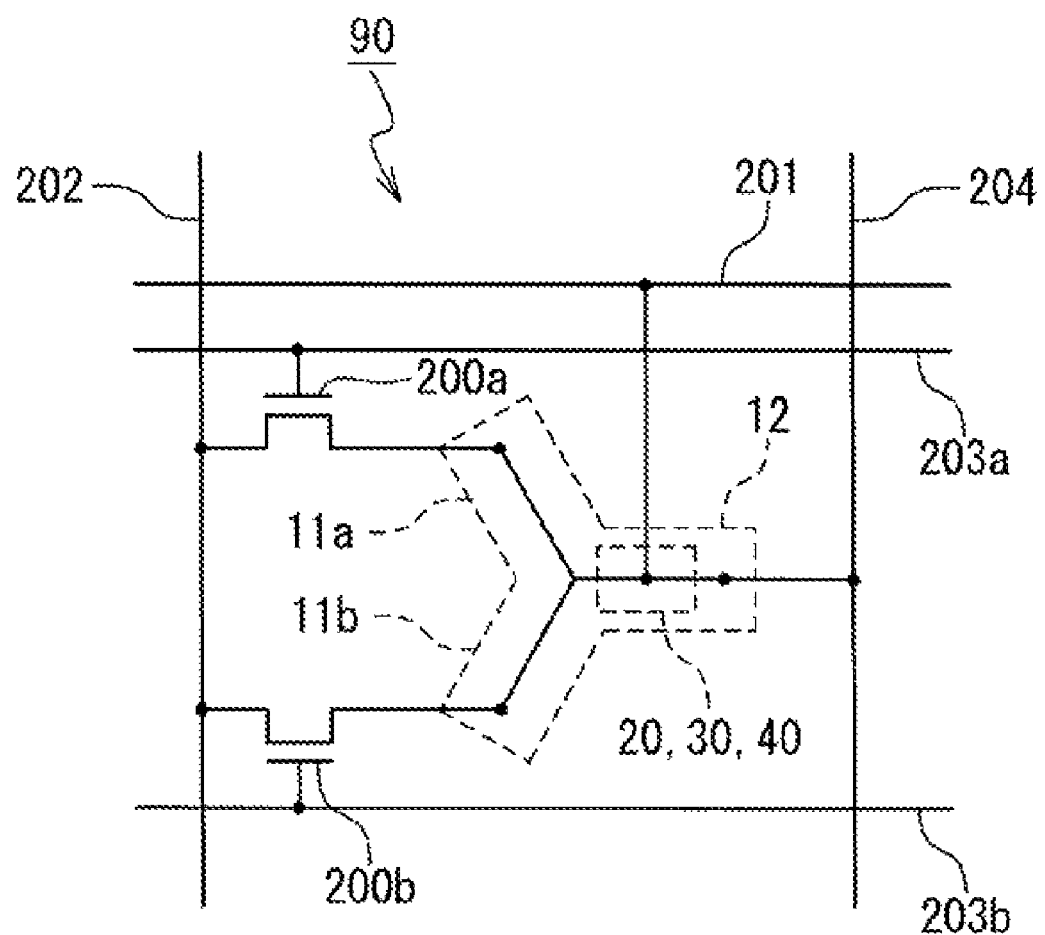
FIG. 13C is a circuit diagram showing a circuit configuration of a memory cell in which the magnetoresistive elements in FIG. 13A are integrated.
Figure 13D:
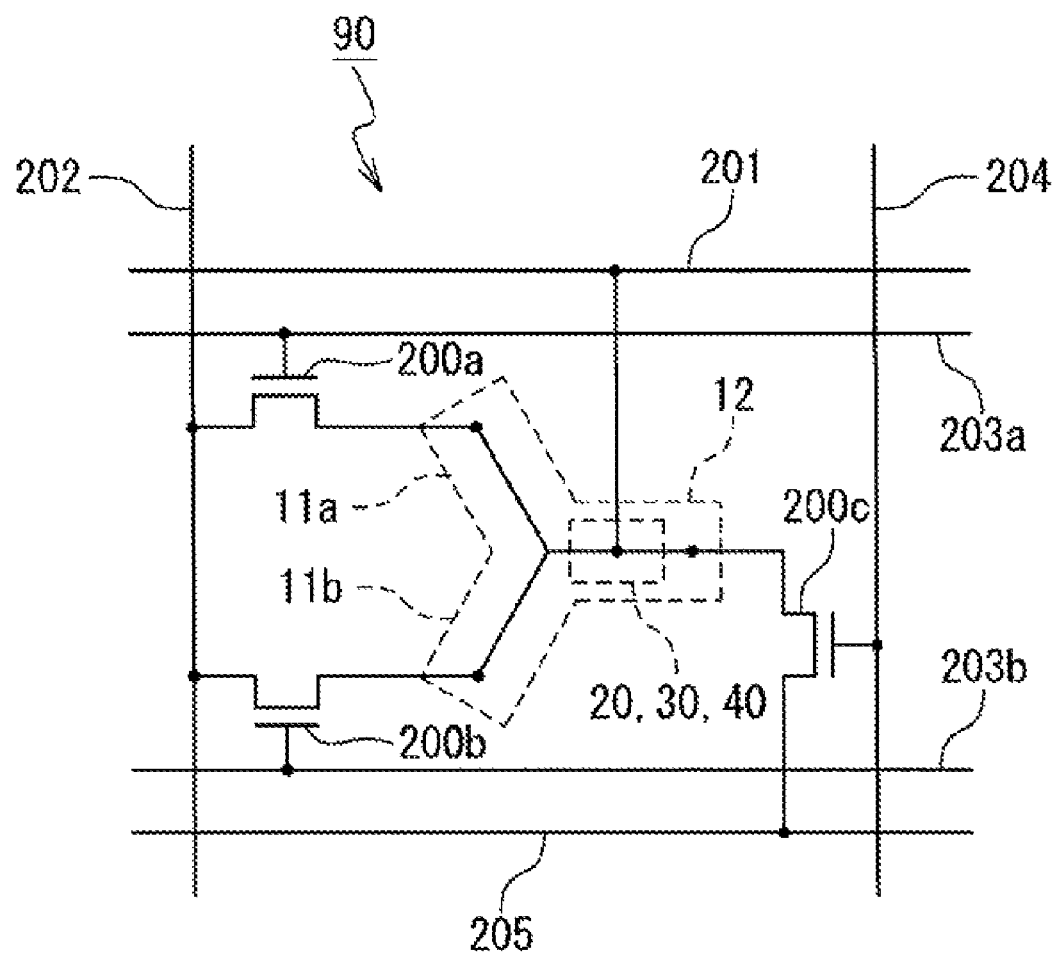
FIG. 13D is a circuit diagram showing another circuit configuration of the memory cell in which the magnetoresistive elements in FIG. 13A are integrated.

FIG. 13C shows one example of the circuit configuration of the memory cell 90 in which the magnetoresistive element having the structure of FIGS. 13A FIG. 13B is integrated. In FIG. 13C, two MOS transistors 200a and 200b are disposed within one memory cell 90. One of the source/drain of the MOS transistor 200a is connected to a ground line 202, and the other is connected to one end (the side opposite to the boundary of the magnetization free region 12) of the first magnetization fixed region 11a. Also, one of the source/drain of the MOS transistor 200b is connected to the ground line 202, and the other is connected to one end (the side opposite to the boundary of the magnetization free region 12) of the second magnetization fixed region 11b. The gate of the MOS transistor 200a is connected to a first word line 203a, and the gate of the MOS transistor 200b is connected to a second word line 203b.

Also, a first bit line 204 is connected to the end (the side opposite to the boundary between the first magnetization fixed region 11a and the second magnetization fixed region 11b) of the magnetization free region 12. This first bit line 204 is a writing interconnection to supply the write current to the first magnetization free layer 10. Also, a second bit line 201 is connected to the first magnetization fixed layer 40, which is one end of the MTJ. The second bit line 201 is a reading interconnection to supply the reading current to the MTJ.

In the circuit configuration shown in FIG. 13C, the data can be discriminately written in accordance with which of the first word line 203a and the second word line 203b is pulled up to the "high" level and which of them is pulled down to the "low" level. For example, when the first word line 203a is set to the "low" level, the second word line 203b is set to the "high" level, the first bit line 204 is set to the "high" level and the ground line 202 is set to the "low" level, then the MOS transistor 200a is turned "OFF" and the MOS transistor 200b is turned "ON". As a result, the write current flows from the first bit line 204 through the magnetization free region 12, the second magnetization fixed region 11b and the MOS transistor 200b to the ground line 202. Also, when the second word line 203b is set to the "low" level, the first word line 203a is set to "high", the first bit line 204 is set to "high", and the ground line 202 is set to "low" level, then the MOS transistor 200b is turned "OFF" and the MOS transistor 200a is turned "ON". As a result, the write current flows from the first bit line 204 through the magnetization free region 12, the first magnetization fixed region 11a and the MOS transistor 200a to the ground line 202. In this way, the data can be discriminately written.

Also, the reading of the data may be performed by using for example, the first method described below. In the first method, the first word line 203a and the second word line 203b are set to "Low", and the second bit line 201 is set to "High", and the first bit line 204 is set to "Ground". At this time, the MOS transistors 200a, 200b are turned "OFF". Then, the current flows from the second bit line 201 to the first bit line 204 through the MTJ. Consequently, the resistance of the MTJ can be read, and the data of the magnetoresistive element can be read. In this case, the data of the cell of the intersection between the first bit line 204 and the second bit line 201 is read, namely, the cross point reading is carried out.

Also, the following second method may be used to read data from the memory cell 90 shown in FIG. 13C. At first, the first word line 203a is set to the "high" level and the second word line 203b is set to the "low" level, and consequently, the MOS transistor 200a is turned "ON" and the MOS transistor 200b is turned "OFF". Also, the ground line 202 is set to the "low" level, and the second bit line 201 is set to the "high" level. Moreover, the first bit line 204 is set to a proper voltage level. At this time, the reading current passes through the MTJ from the second bit line 201 and flows through the MOS transistor 200a to the ground line 202 without flowing through the first bit line 204. This method also allows reading the resistance value of the MTJ. In the second method, a high speed read operation can be attained, since one memory cell is selected by the MOS transistor 200a, differently from the reading used in the first method.

Another circuit configuration shown in FIG. 13D may be applied to the memory cell 90 in this embodiment. The difference between FIGS. 13D and 13C lies in a structure in which three MOS transistors are formed in the memory cell 90. Specifically, one of the source/drain of a MOS transistor 200c is connected to the end (the side opposite to the first magnetization fixed region 11a and the second magnetization fixed region 11b) of the magnetization free region 12, and the other source/drain of the MOS transistor 200c is connected to a third bit line 205. Also, the gate of the MOS transistor 200c is connected to a third word line 203c.

Also in the memory cell 90 shown in FIG. 13D, the data can be discriminately written in accordance with which of the first word line 203a and the second word line 203b is set to the "low" level and which of them is set to the "high" level. For example, when the first word line 203a is set to the "low" level, the second word line 203b is set to the "high" level, and the third word line 203c is set to the "high" level, then the MOS transistor 200a is turned "OFF", the MOS transistor 200b is turned "ON", and the MOS transistor 200c is turned "ON". Here, when the third bit line 205 is set to the "high" level and the ground line 202 is set to the "low" level, the write current flows from the third bit line 205 to the ground line 202 through the MOS transistor 200c, the magnetization free region 12, the second magnetization fixed region 11b and the MOS transistor 200b. Also, when the second word line 203b is set to the "low" level, the first word line 203a is set to "high" and the third word line 203c is set to "high", then the MOS transistor 200b is turned "OFF", the MOS transistor 200a is turned "ON", and the MOS transistor 200c is turned "ON". Here, when the third bit line 205 is set to the "high" level and the ground line 202 is set to the "low" level, the write current flows from the third bit line 205 to the ground line 202 through the MOS transistor 200c, the magnetization free region 12, the first magnetization fixed region 11a and the MOS transistor 200a. In this way, the data can be discriminately written.

Furthermore, the reading of the data from the magnetic memory cell 90 shown in FIG. 13D can be performed, for example, as shown in the following manners. At first, the first word line 203a is set to the "low" level, the second word line 203b is set to the "low" level, and the third word line 203c is set to the "high" level. At this time, the MOS transistor 200a and the MOS transistor 200b are turned "OFF", and the MOS transistor 200c is turned "ON". Here, since the second bit line 201 is set to the "high" level and the third bit line 205 is turned "ON", the reading current passes through the MTJ from the second bit line 201 and flows through the MOS transistor 200c to the third bit line 205. Consequently, the data can be read.

It should be noted that the circuit configuration and operation which are described herein are only one example. The magnetoresistive elements having the structure shown in FIGS. 13A and 13B can be integrated into the memory cell 90 even when other circuit configurations and circuit settings are used.

(Sixth Modification)

Figure 14A:
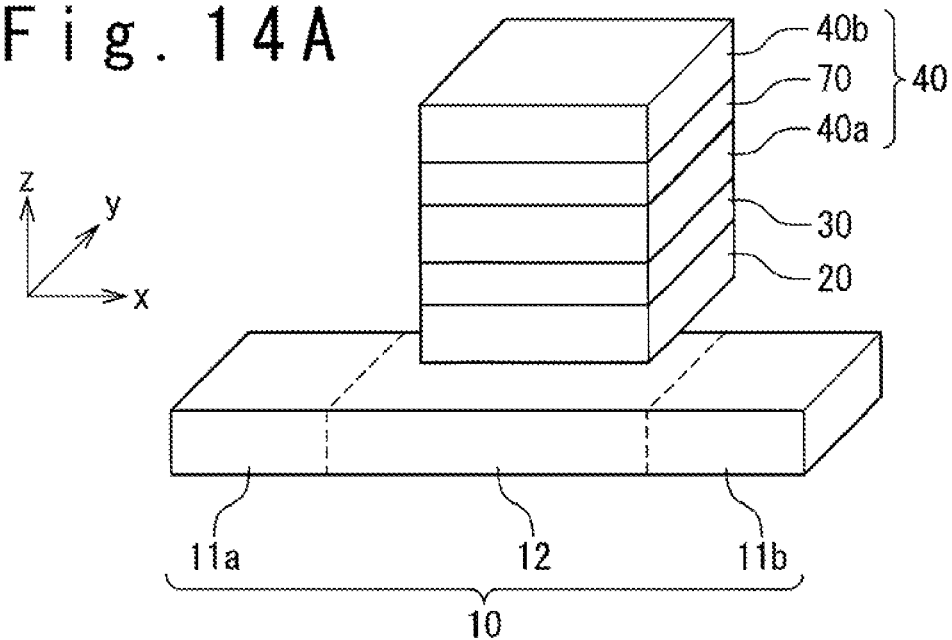
FIG. 14A is a perspective view showing a configuration of a sixth modification of the magnetoresistive element in this embodiment.
Figure 14B:
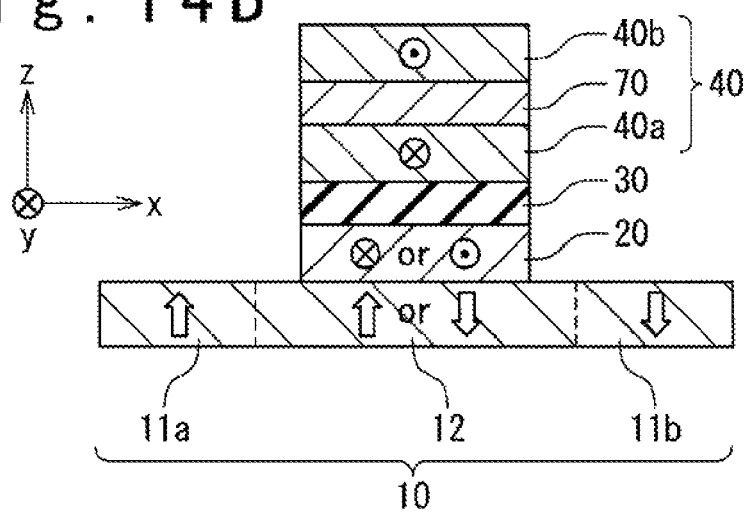
FIG. 14B is a sectional view showing the configuration of the magnetoresistive element in FIG. 14A.
Figure 14C:
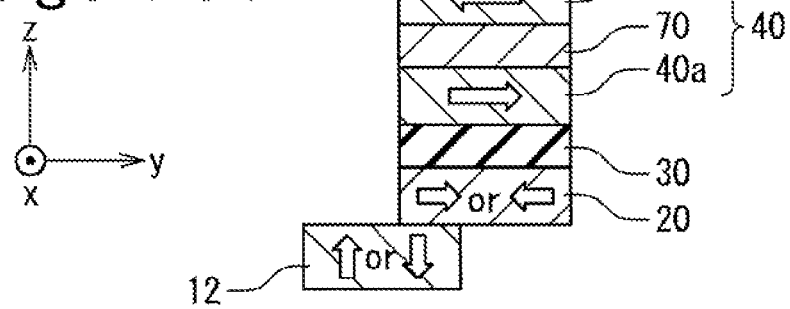
FIG. 14C is a sectional view showing the configuration of the magnetoresistive element in FIG. 14A.

FIGS. 14A to 14C schematically show the structure of the sixth modification of the magnetoresistive element in this embodiment. FIG. 14A shows a perspective view, FIG. 14B shows an x-z sectional view, and FIG. 14C shows a y-z sectional view. It should be noted that examples of the magnetization directions of the respective layers are shown by arrows in FIG. 14B and FIG. 14C. The sixth modification employs a synthetic antiferromagnet configuration in which the first magnetization fixed layer 40 includes a plurality of ferromagnetic layers.

In the magnetoresistive element in this embodiment, the first magnetization fixed layer 40 may be structured such that the magnetization is fixed in one direction on the surface in contact with the nonmagnetic layer 30 and may be composed of a plurality of layers. In particular, as shown in FIGS. 14A to 14C, the use of the synthetic antiferromagnet allows increase in the durability against the external disturbance magnetic field and reduction in the influence of the offset magnetic field applied to the second magnetization free layer 20 and the first magnetization free layer 10. FIG. 14B shows a situation in which ferromagnetic films 40a and 40b are coupled in the anti-parallel directions through a coupling layer 70 in the first magnetization fixed layer 40. When such synthetic antiferromagnet is used, the magnetization of the first magnetization fixed layer 40 becomes resistive against the external disturbance magnetic field. In addition, the influence of the leakage magnetic flux on the external world can be reduced by approximately equalizing the products (Ms·t) of the saturation magnetizations (Ms) and the film thicknesses (t) of the ferromagnetic films 40a and 40b. Thereby, the magnetic influence on the second magnetization free layer 20, the first magnetization free layer 10 and the adjacent memory cells can be reduced. It should be noted that, although FIGS. 14A to 14C exemplify the examples in which the first magnetization fixed layer 40 is composed of the two-layer ferromagnetic film and the one-layer coupling layer, the first magnetization fixed layer 40 may be composed of more layers.

The material of the coupling layer 70 is exemplified by Ru, for example. When Ru is used as the coupling layer 70, an RKKY interaction causes the ferromagnetic films 40a and 40b, which are adjacent to each other, to be strongly coupled. It should be noted, however, that the ferromagnetic films 40a and 40b may be coupled by the leakage magnetic flux, and from this aspect, any conductive materials may be thus used as the material of the coupling layer 70.

(Seventh Modification)

Figure 15A:
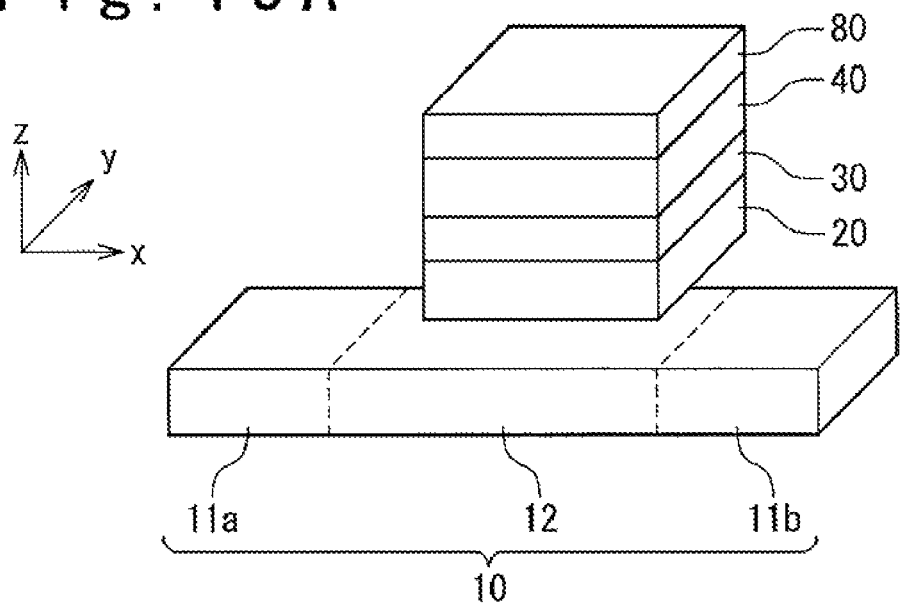
FIG. 15A is a perspective view showing a configuration of a seventh modification of the magnetoresistive element in this embodiment.
Figure 15B:
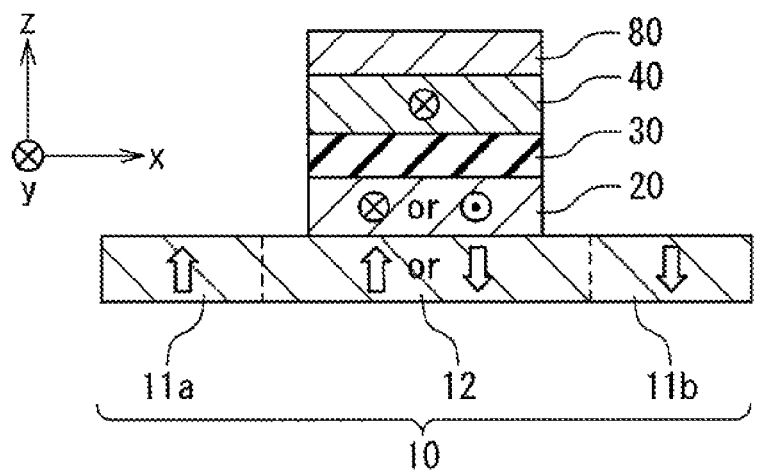
FIG. 15B is a sectional view showing the configuration of the magnetoresistive element in FIG. 15A.
Figure 15C:
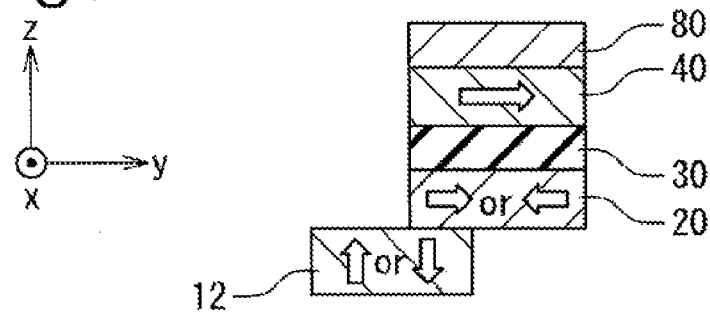
FIG. 15C is a sectional view showing the configuration of the magnetoresistive element in FIG. 15A.

FIGS. 15A to 15C schematically show the structure of the seventh modification of the magnetoresistive element in this embodiment. FIG. 15A shows the perspective view, FIG. 15B shows the x-z sectional view, and FIG. 15C shows the y-z sectional view. In the seventh modification, a pinning layer 80 joined to the first magnetization fixed layer 40 is formed.

In the magnetoresistive element in this embodiment, the magnetization of the first magnetization fixed layer 40 is substantially fixed in a particular direction. In the seventh modification, the pinning layer 80 is formed to be joined to at least a part of the first magnetization fixed layer 40. This further stabilizes the fixed magnetization of the first magnetization fixed layer 40. As the material of the pinning layer 80, ferromagnetic material, for example, such as Pt—Mn and the like may be used.

(Eighth Modification)

Figure 16A:
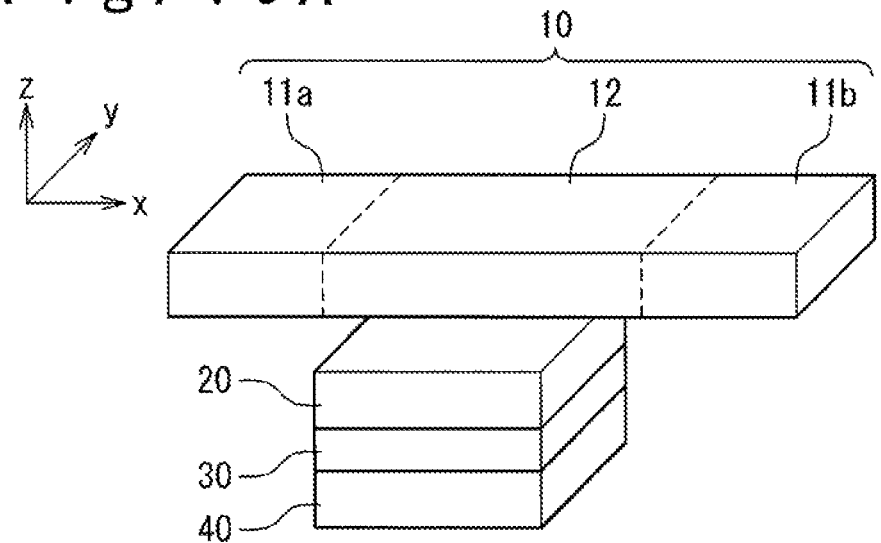
FIG. 16A is a perspective view showing a configuration of an eighth modification of the magnetoresistive element in this embodiment.
Figure 16B:
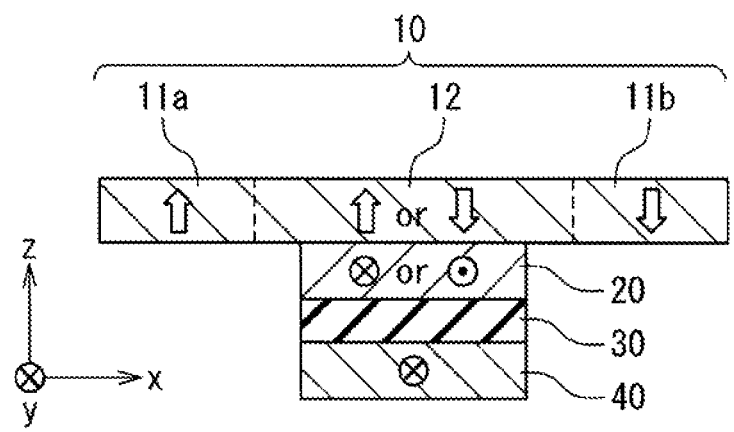
FIG. 16B is a sectional view showing the configuration of the magnetoresistive element in FIG. 16A.
Figure 16C:
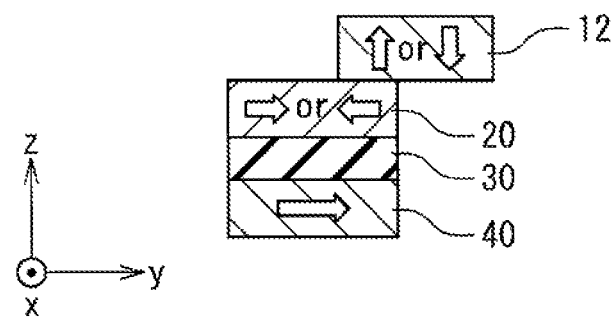
FIG. 16C is a sectional view showing the configuration of the magnetoresistive element in FIG. 16A.

FIGS. 16A to 16C schematically show the structure of the eighth modification of the magnetoresistive element in this embodiment. FIG. 16A shows the perspective view, FIG. 16B shows the x-z sectional view, and FIG. 16C show the y-z sectional view. The eighth modification relates to the lamination order of the respective layers.

In the magnetoresistive element in this embodiment, the second magnetization free layer 20, the nonmagnetic layer 30 and the first magnetization fixed layer 40 may be successively formed in this order, and the lamination order thereof, and the first magnetization free layer 10 or the second magnetization fixed layer 60a and the third magnetization fixed layer 60b is arbitrary. Thus, as shown in FIGS. 16A to 16C, the first magnetization free layer 10 may be formed on the top surface. Also, in this case, the center of mass of the magnetization free region 12 and the second magnetization free layer 20 are required to be displaced in the x-y plane, while the positional and size relations are arbitrary.

(Ninth Modification)

Figure 17A:
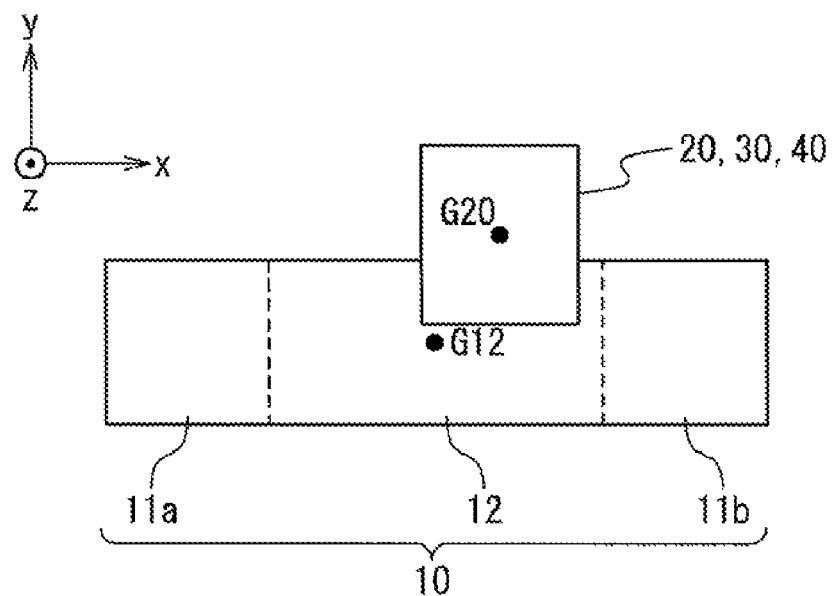
FIG. 17A is a plan view showing a configuration of a ninth modification of the magnetoresistive element in this embodiment.
Figure 17B:
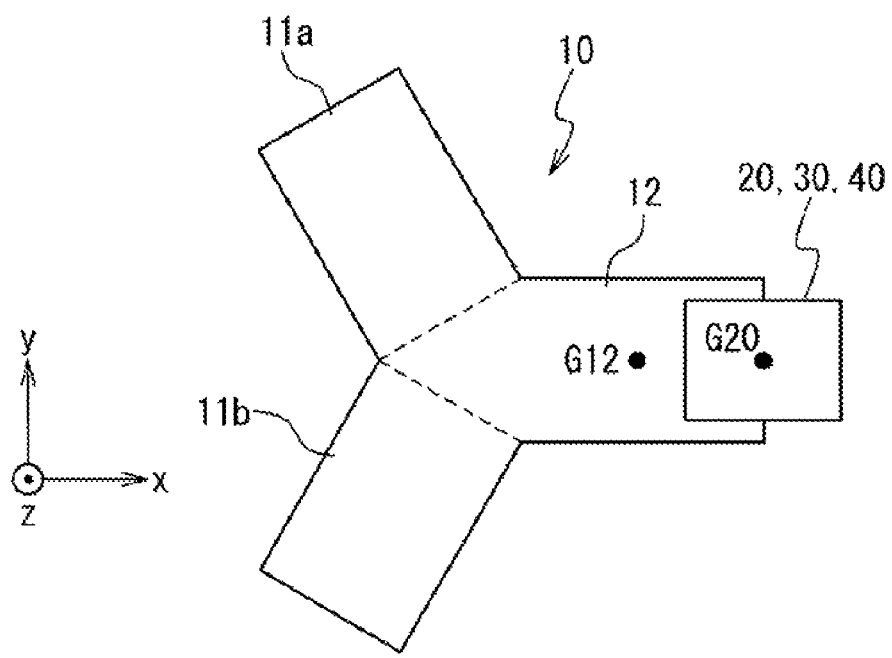
FIG. 17B is a plan view showing another configuration of the ninth modification of the magnetoresistive element in this embodiment.

FIG. 17A is the plan view that schematically shows the structure of the ninth modification of the magnetoresistive element in this embodiment. In this embodiment, the center of mass G20 of the second magnetization free layer 20 is disposed displaced in a particular direction in the in-plane direction (the direction parallel to the x-y flat plane) with respect to the center of mass G12 of the magnetization free region 12. Although this particular direction is directed in a direction approximately parallel to the +y direction in the drawings mentioned above, this particular direction may be arbitrarily determined. Thus, as shown in FIG. 17A, the particular direction may have an x-component. Also, when the first magnetization free layer 10 is configured in a shape which forms a junction of three elements as explained by using FIGS. 13A and 13B, the positional relation between the center of mass G20 of the second magnetization free layer 20 and the center of mass G12 of the magnetization free region 12 is allowable as shown in FIG. 17B.

(Tenth Modification)

Figure 18A:
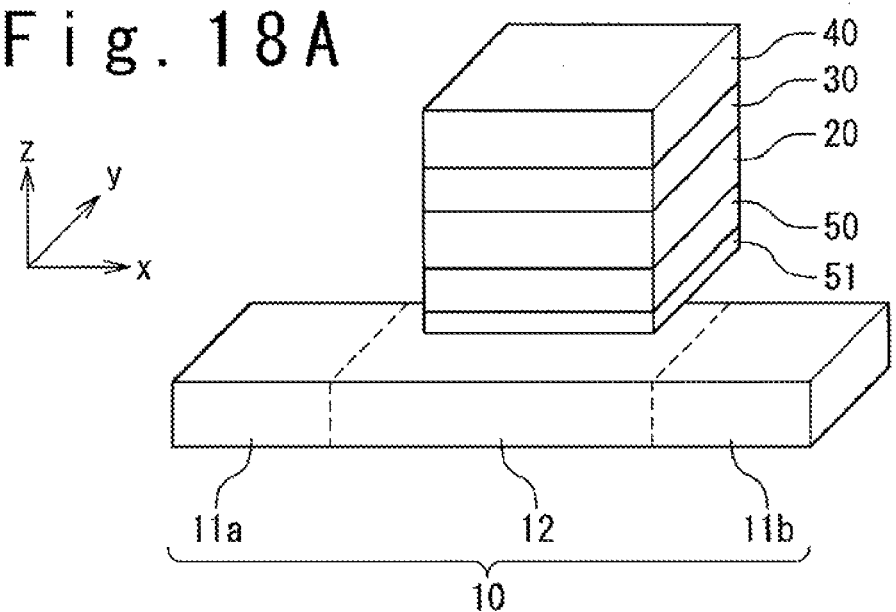
FIG. 18A is a perspective view showing a configuration of a tenth modification of the magnetoresistive element in this embodiment.
Figure 18B:
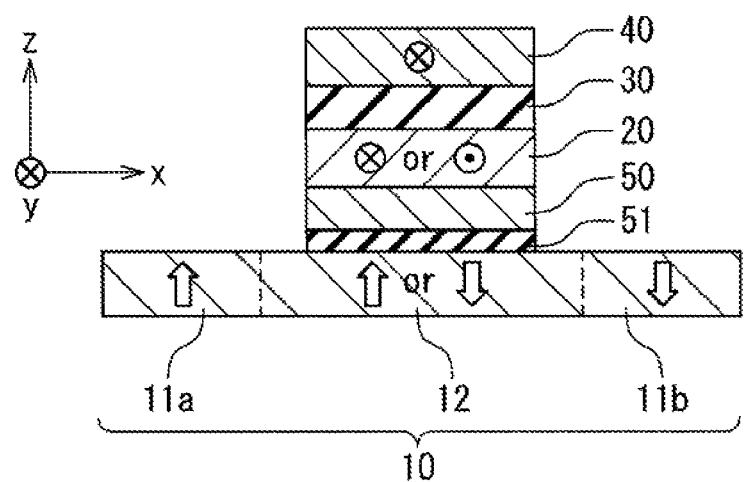
FIG. 18B is a sectional view showing the configuration of the magnetoresistive element in FIG. 18A.
Figure 18C:
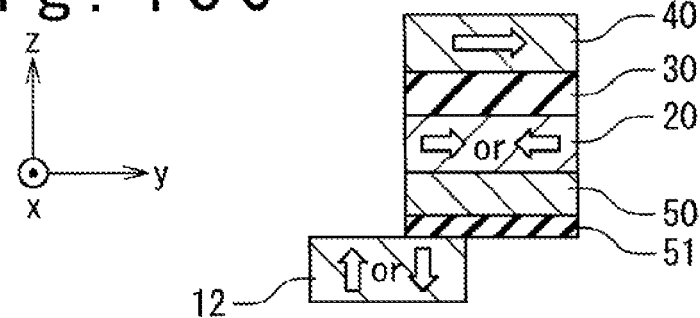
FIG. 18C is a sectional view showing the configuration of the magnetoresistive element in FIG. 18A.
Figure 19A:
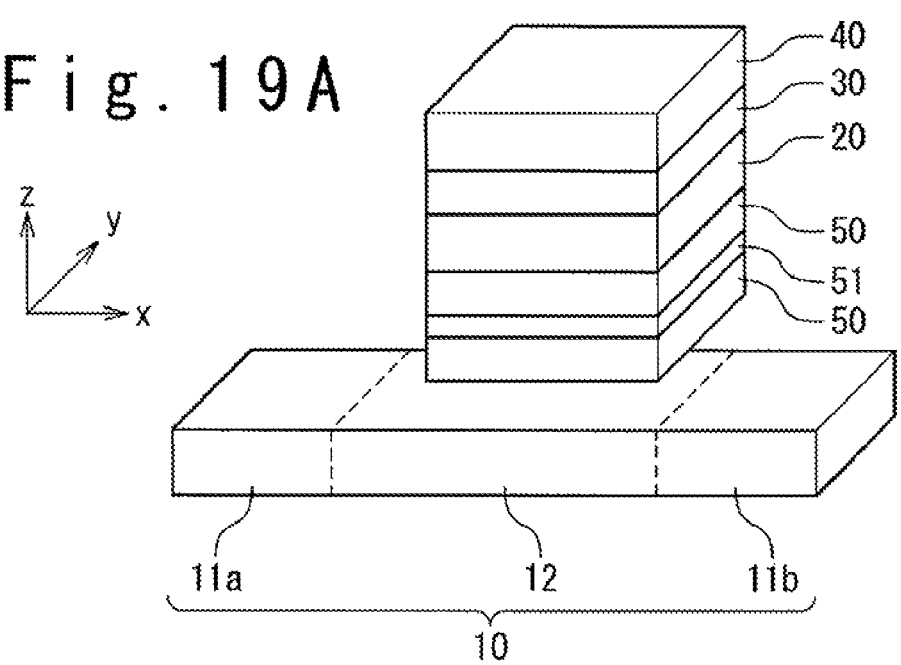
FIG. 19A is a perspective view showing another configuration of the tenth modification of the magnetoresistive element in this embodiment.
Figure 19B:
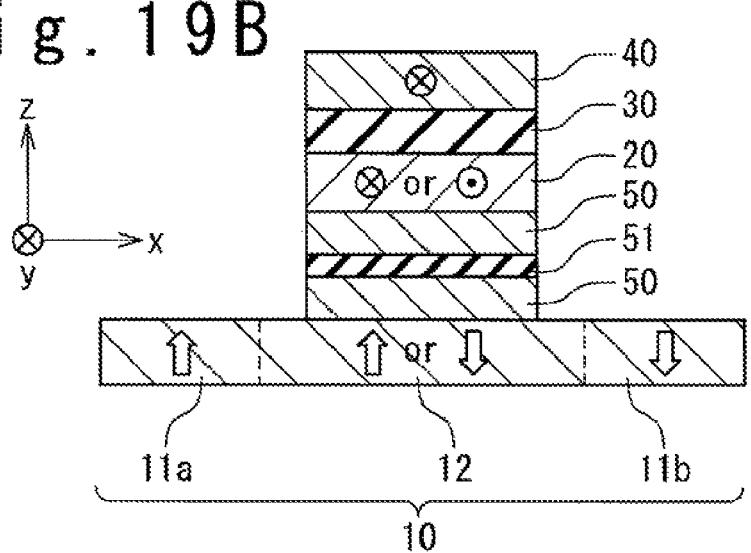
FIG. 19B is a sectional view showing the configuration of the magnetoresistive element in FIG. 19A.
Figure 19C:
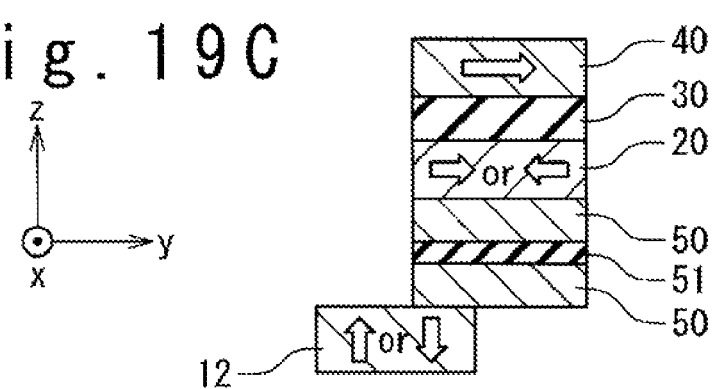
FIG. 19C is a sectional view showing the configuration of the magnetoresistive element in FIG. 19A.

FIGS. 18A to 18C, 19A to 19C and 20A to 20C are views that schematically show structures of the tenth modification of the magnetoresistive element in this embodiment. In detail, FIGS. 18A and 19A show the perspective view, FIGS. 18B and 19B show the x-z sectional view, and FIGS. 18C and 19C show the y-z sectional view. The tenth modification relates to variations in the configurations of FIGS. 1A to 1C, 4A to 4C and 5A to 5C, wherein FIGS. 1A to 1D show the basic configuration in which the second magnetization free layer 20 is formed adjacently to the first magnetization free layer 10, and FIGS. 4A to 4C and 5A to 5C show the configurations in which the conductive layer 50 is formed between the first magnetization free layer 10 and the second magnetization free layer 20.

In the tenth modification, a branching prevention layer 51 is formed between the first magnetization free layer 10 and the second magnetization free layer 20. The branching prevention layer 51 is formed of a film which has a higher sheet resistance than that of the first magnetization free layer 10. The branching prevention layer 51 may be formed at the various positions between the first magnetization free layer 10 and the second magnetization free layer 20.

Figure 20A:
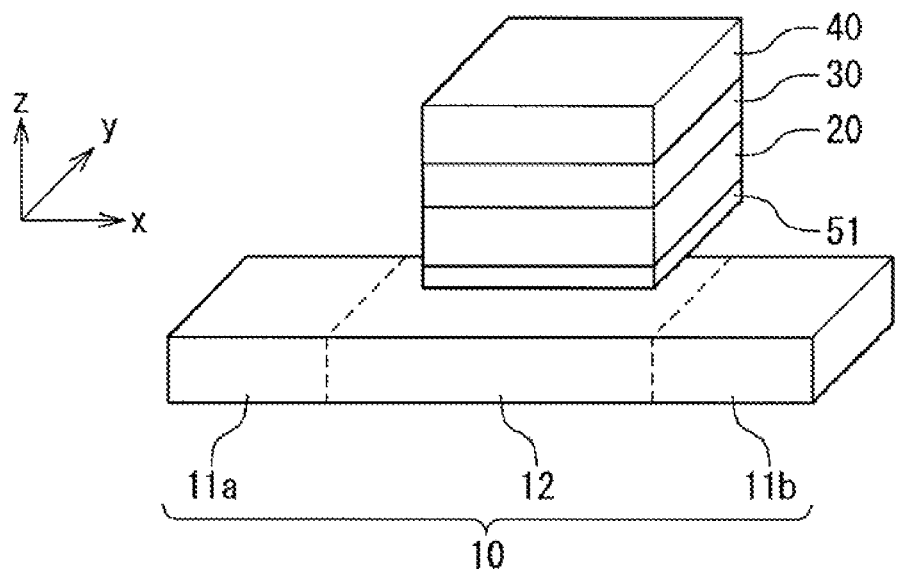
FIG. 20A is a perspective view showing still another configuration of the tenth modification of the magnetoresistive element in this embodiment.
Figure 20B:
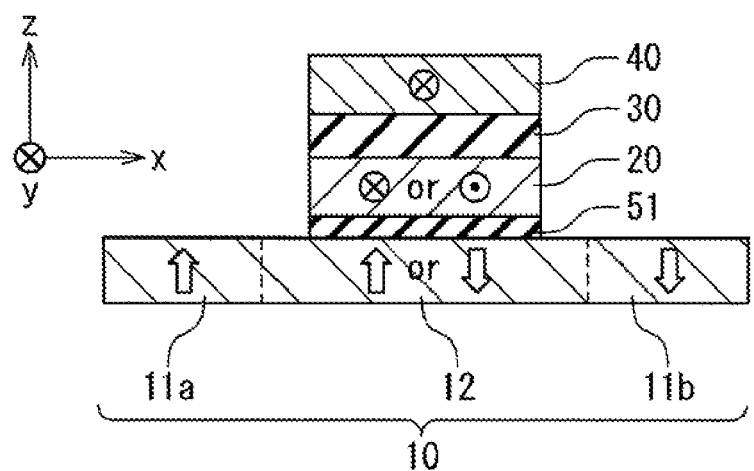
FIG. 20B is a sectional view showing the configuration of the magnetoresistive element in FIG. 20A.
Figure 20C:
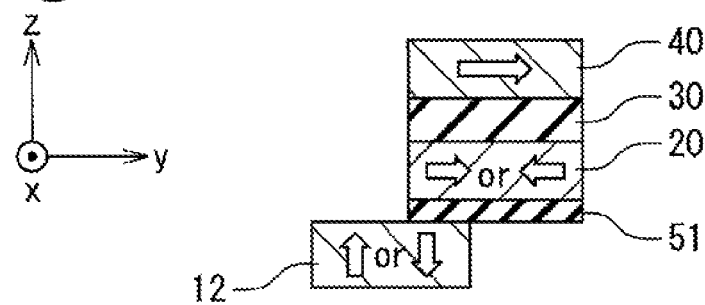
FIG. 20C is a sectional view showing the configuration of the magnetoresistive element in FIG. 20A.

As shown in FIGS. 18A to 18C, for example, the branching prevention layer 51 may be disposed between the conductive layer 50 and the first magnetization free layer 10, when the conductive layer 50 is formed. Also, as shown in FIGS. 19A to 19C, the branching prevention layer 51 may be formed in the conductive layer 50. Also, as shown in FIGS. 20A to 20C, the branching prevention layer 51 may be disposed between the first magnetization free layer 10 and the second magnetization free layer 20, when the first magnetization free layer 10 and the second magnetization free layer 20 are directly connected.

The formation of the branching prevention layer 51 causes the following effects: As mentioned above, the introduction of a current into the first magnetization free layer 10 causes the domain wall motion in the magnetoresistive element, thereby writing data. Thus, in order to increase the current efficiency of the domain wall motion, the ratio of the write current flowing through the first magnetization free layer 10 is desired to be as high as possible. Here, in a case when the conductive layer 50 is formed, or when the second magnetization free layer 20 is formed adjacently to the first magnetization free layer 10, the write, current is partially branched into the conductive layer 50 and also the second magnetization free layer 20, as well as the first magnetization free layer 10, in the portion of the first magnetization free layer 10 connected to the conductive layer 50 or second magnetization free layer 20. This may cause an unstable operation such as the increase in the write current, the middle state generation and the like. In this modification, the branching component in the write current, which flows through the conductive layer 50 and/or the second magnetization free layer 20, is reduced, thereby solving the foregoing problem, since the branching prevention layer 51 is formed between the first magnetization free layer 10 and the second magnetization free layer 20, preferably, between the first magnetization free layer 10 and the conductive layer 50.

It should be noted that the resistance value of the branching prevention layer 51 is preferred not to be excessively large, since the read current is introduced in the path which passes through the conductive layer 50 or the second magnetization free layer 20 and the branching prevention layer 51 as mentioned above. Hence, the resistance value of the branching prevention layer 51 is preferably designed to be large to an extent that the branching of the write current is sufficiently decreased and to be small to an extent that the read signal is not deteriorated.

Examples of the material of the branching prevention layer 51 include the oxide, the nitride and the like of metal such as Mg and Al. For example, a preferred property is acquired when the branching prevention layer 51 is formed of MgO with a film thickness of 0.3 nm to 1.2 nm.

It should be noted that the branching prevention layer 51 may be disposed for making the manufacturing process easy or improving the property of the film, by properly selecting the position to be formed and the material and composition, as well as for avoiding the current from branching into the conduction layer 51 and the second magnetization free layer 20 as mentioned above.

Although embodiments of the present invention and their various modifications are described above, the present invention should not be construed limitedly to the above-mentioned embodiments and modifications. The person skilled in the art would appreciate that the plurality of above-mentioned modifications may be combined in applications, unless the combination is conflicting.

What is claimed is:

1. A magnetoresistive element, comprising:
    a first magnetization free layer;
    a second magnetization free layer;
    a non-magnetic layer disposed adjacent to the second magnetization free layer; and
    a first magnetization fixed layer disposed adjacent to said second magnetization free layer on an opposite side of said second magnetization free layer,
    wherein said first magnetization free layer is formed of ferromagnetic material and has a magnetic anisotropy in a thickness direction,
    wherein said second magnetization free layer and said first magnetization fixed layer are formed of ferromagnetic material and have a magnetic anisotropy in an in-plane direction,
    wherein said first magnetization free layer includes:
        a first magnetization fixed region having a fixed magnetization;
        a second magnetization fixed region having a fixed magnetization; and
        a magnetization free region connected to said first and second magnetization fixed regions and having a reversible magnetization,
    wherein said magnetization free region and said second magnetization free layer are magnetically coupled, and
    wherein a center of mass of said magnetization free region and a center of mass of said second magnetization free layer are displaced in a particular in-plane direction.

2. The magnetoresistive element according to claim 1, wherein the magnetization of said first magnetization fixed layer is fixed in a direction approximately parallel to said particular direction.

3. The magnetoresistive element according to claim 1, further comprising:
    a conduction layer disposed between said first and second magnetization free layers.

4. The magnetoresistive element according to claim 1, further comprising:
    a second magnetization fixed layer coupled to one of said first and second magnetization fixed regions.

5. The magnetoresistive element according to claim 4, further comprising:
    a third magnetization fixed layer coupled to the other of said first and second magnetization fixed regions.

6. The magnetoresistive element according to claim 1, wherein said first magnetization fixed region is disposed adjacent to one end of said magnetization free region, and
    wherein aid second magnetization fixed region is disposed adjacent to the other end of said magnetization free region.

7. The magnetoresistive element according to claim 1, wherein said first magnetization fixed region is disposed adjacent to one end of said magnetization free region,
    wherein said second magnetization fixed region is disposed adjacent to said one end of said magnetization free region, and
    wherein said first magnetization fixed region, said second magnetization fixed region, and said magnetization free region form a junction of three elements.

8. The magnetoresistive element according to claim 3, wherein said conduction layer includes at least one element selected from the group consisting of Fe, Co and Ni.

9. The magnetoresistive element according to claim 1, wherein said non-magnetic layer includes MgO.

10. The magnetoresistive element according to claim 1, wherein at least one of said second magnetization free layer and said first magnetization fixed layer includes Co—Fe—B.

11. The magnetoresistive element according to claim 1, further comprising:
    a branching prevention layer disposed between said first and second magnetization free layers.

12. The magnetoresistive element according to claim 3, further comprising:
    a branching prevention layer disposed between said first magnetization free layer and said conduction layer.

13. The magnetoresistive element according to claim 11, wherein said branching prevention layer is formed of a film having a sheet resistance higher than that of said first magnetization free layer.

14. The magnetoresistive element according to claim 12, wherein said branching prevention layer is formed of a film having a sheet resistance higher than that of said first magnetization free layer.

* * * * *